US009206074B2

(12) United States Patent
Yanase et al.

(10) Patent No.: US 9,206,074 B2
(45) Date of Patent: Dec. 8, 2015

(54) HIGH-REFRACTIVE-INDEX GLASS

(75) Inventors: Tomoki Yanase, Shiga (JP); Takashi Murata, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 15 days.

(21) Appl. No.: 13/885,213

(22) PCT Filed: Dec. 7, 2011

(86) PCT No.: PCT/JP2011/078292
§ 371 (c)(1),
(2), (4) Date: May 14, 2013

(87) PCT Pub. No.: WO2012/077708
PCT Pub. Date: Jun. 14, 2012

(65) Prior Publication Data
US 2013/0230692 A1    Sep. 5, 2013

(30) Foreign Application Priority Data

Dec. 8, 2010 (JP) ................. 2010-273464
Dec. 8, 2010 (JP) ................. 2010-273465
Dec. 8, 2010 (JP) ................. 2010-273466

(51) Int. Cl.
| | |
|---|---|
| *C03C 3/097* | (2006.01) |
| *C03C 3/095* | (2006.01) |
| *C03C 3/062* | (2006.01) |
| *C03C 3/068* | (2006.01) |
| *C03C 3/087* | (2006.01) |
| *C03C 3/064* | (2006.01) |
| *C03C 3/091* | (2006.01) |
| *C03C 3/093* | (2006.01) |
| *H01L 31/0392* | (2006.01) |
| *H01L 51/00* | (2006.01) |
| *H01L 51/52* | (2006.01) |

(52) U.S. Cl.
CPC .............. *C03C 3/095* (2013.01); *C03C 3/062* (2013.01); *C03C 3/064* (2013.01); *C03C 3/068* (2013.01); *C03C 3/087* (2013.01); *C03C 3/091* (2013.01); *C03C 3/093* (2013.01); *C03C 3/097* (2013.01); *H01L 31/0392* (2013.01); *H01L 51/0096* (2013.01); *H01L 51/5262* (2013.01); *H01L 2251/55* (2013.01); *Y02E 10/50* (2013.01); *Y10T 428/24355* (2015.01)

(58) Field of Classification Search
CPC ........ C03C 3/097; C03C 3/095; C03C 3/087; C03C 3/062; C03C 3/068; C03C 3/091; C03C 3/093; C03C 3/064; C03C 3/078; C03C 3/085
USPC ......... 501/63, 64, 65, 66, 70, 73, 78
See application file for complete search history.

(56) References Cited

U.S. PATENT DOCUMENTS

| | | | | |
|---|---|---|---|---|
| 3,143,432 A | * | 8/1964 | Meinert et al. ................. 501/78 |
| 3,174,871 A | * | 3/1965 | Geffcken et al. ............... 501/78 |
| 3,578,470 A | * | 5/1971 | Bahat et al. ...................... 501/8 |
| 3,964,918 A | * | 6/1976 | Hares et al. ..................... 501/78 |
| 4,055,435 A | * | 10/1977 | Sagara ............................ 501/63 |
| 4,057,435 A | * | 11/1977 | Boudot et al. .................. 501/78 |
| 4,179,300 A | * | 12/1979 | Sagara ............................ 501/79 |
| 4,404,290 A | * | 9/1983 | Boudot ........................... 501/78 |
| 5,932,501 A |   | 8/1999 | Brocheton |
| 7,015,164 B2 | * | 3/2006 | Kasuga et al. .................. 501/73 |
| 2004/0220038 A1 | * | 11/2004 | Wolff et al. .................... 501/64 |
| 2004/0229743 A1 | * | 11/2004 | Wolff et al. .................... 501/67 |
| 2005/0272589 A1 |   | 12/2005 | Shimizu |
| 2008/0220961 A1 |   | 9/2008 | Uehara et al. |
| 2008/0231972 A1 | * | 9/2008 | Hachitani et al. ............. 359/809 |
| 2008/0318758 A1 |   | 12/2008 | Imakita et al. |
| 2009/0088310 A1 | * | 4/2009 | Suzuki et al. .................. 501/78 |
| 2009/0105061 A1 | * | 4/2009 | Fujiwara et al. ............... 501/78 |
| 2009/0149307 A1 |   | 6/2009 | Shimizu |
| 2009/0197088 A1 |   | 8/2009 | Murata |
| 2009/0226733 A1 |   | 9/2009 | Kato et al. |
| 2009/0325779 A1 | * | 12/2009 | Negishi et al. ................. 501/78 |
| 2010/0255979 A1 |   | 10/2010 | Fujiwara |
| 2010/0255981 A1 | * | 10/2010 | Morisada ....................... 501/78 |
| 2010/0271830 A1 | * | 10/2010 | Morisada ..................... 362/317 |
| 2010/0277927 A1 | * | 11/2010 | Morisada ..................... 362/317 |
| 2010/0292066 A1 |   | 11/2010 | Zou et al. |
| 2011/0123832 A1 | * | 5/2011 | Matsumoto et al. ....... 428/846.9 |
| 2011/0318561 A1 |   | 12/2011 | Murata et al. |

(Continued)

FOREIGN PATENT DOCUMENTS

| | | |
|---|---|---|
| CN | 1198728 | 11/1998 |
| CN | 1704369 | 12/2005 |
| CN | 101389574 | 3/2009 |

(Continued)

OTHER PUBLICATIONS

Derwent Abstract 1984-110259 of JP 59-050048 A, Mar. 22, 1984.*
International Preliminary Report on Patentability and Written Opinion of the International Searching Authority mailed Jun. 20, 2013 in International (PCT) Application No. PCT/JP2011/078292.
International Search Report issued Mar. 13, 2012 in International (PCT) Application No. PCT/JP2011/078292.
First Office Action issued Sep. 29, 2014 in corresponding Chinese Application No. 201180050413.5 (with English translation).
Second Office Action issued Mar. 13, 2015 in corresponding Chinese Application No. 201180050413.5 (with English translation).
German Office Action issued May 6, 2015 in corresponding German Patent Application No. 112011104339.2 (with English translation).

*Primary Examiner* — Anthony J Green
*Assistant Examiner* — Elizabeth A Bolden
(74) *Attorney, Agent, or Firm* — Wenderoth, Lind & Ponack, L.L.P.

(57) ABSTRACT

Provided is a high refractive index glass, comprising, as a glass composition in terms of mass %, 0.1 to 60% of $SiO_2+Al_2O_3+B_2O_3$, having a mass ratio $(BaO+La_2O_3+Nb_2O_5+TiO_2+ZrO_2)/(SiO_2+Al_2O_3+B_2O_3)$ of 0.1 to 50, a mass ratio $(MgO+CaO+SrO+BaO)/(BaO+La_2O_3+Nb_2O_5+TiO_2+ZrO_2)$ of 0 to 10, and a mass ratio $(TiO_2+ZrO_2)/(BaO+La_2O_3+Nb_2O_5)$ of 0.001 to 40, and having a refractive index nd of 1.55 to 2.3.

13 Claims, No Drawings

(56) References Cited

U.S. PATENT DOCUMENTS

| | | |
|---|---|---|
| 2011/0318571 A1 | 12/2011 | Murata |
| 2011/0318572 A1 | 12/2011 | Murata |
| 2012/0114904 A1 | 5/2012 | Yanase et al. |
| 2012/0141760 A1 | 6/2012 | Murata |
| 2012/0141801 A1 | 6/2012 | Murata |
| 2012/0238436 A1* | 9/2012 | Taguchi ............ 501/78 |
| 2012/0251827 A1 | 10/2012 | Murata |
| 2013/0079213 A1 | 3/2013 | Fujiwara |
| 2013/0217807 A1* | 8/2013 | McGinnis et al. ............ 523/458 |

FOREIGN PATENT DOCUMENTS

| | | |
|---|---|---|
| CN | 101679103 | 3/2010 |
| CN | 101772470 | 7/2010 |
| EP | 2 452 926 | 5/2012 |
| JP | 59-050048 | 3/1984 |
| JP | 09-255355 | 9/1997 |
| JP | 2007-269544 | 10/2007 |
| KR | 10-2010-0115739 | 10/2010 |
| WO | 2010/107111 | 9/2010 |
| WO | 2011/004844 | 1/2011 |

* cited by examiner

HIGH-REFRACTIVE-INDEX GLASS

TECHNICAL FIELD

The present invention relates to a high refractive index glass, and more specifically, to a high refractive index glass suitable for, for example, an OLED device, in particular, an OLED lighting device.

BACKGROUND ART

In recent years, attention has been increasingly paid to a display and a lighting device which use an OLED light-emitting element. Each of the OLED devices has a structure in which an organic light-emitting element is sandwiched by substrates on which a transparent conductive film such as an ITO film is formed. When an electric current flows through the organic light-emitting element in this structure, a hole and an electron in the organic light-emitting element are combined to emit light. The emitted light enters a substrate via the transparent conductive film such as an ITO film and is released out while repeating reflection in the substrate.

SUMMARY OF INVENTION

Technical Problem

Meanwhile, the organic light-emitting element has a refractive index nd of 1.8 to 1.9, and ITO has a refractive index nd of 1.9 to 2.0. On the other hand, the substrate usually has a refractive index nd of about 1.5. Thus, a conventional OLED device involves a problem in that a difference in refractive index between the substrate and the ITO film at their interface leads to a high reflectance, and hence light emitted from the organic light-emitting element cannot be extracted efficiently.

Thus, a technical object of the present invention is to provide a high refractive index glass which can have a refractive index matching that of an organic light-emitting element and that of an ITO film.

Solution to Problem

The inventors of the present invention have made extensive studies, and have consequently found that the above-mentioned technical object can be achieved by restricting a glass composition range and glass characteristics within predetermined ranges. The finding is proposed as a first invention. That is, a high refractive index glass according to the first invention comprises, as a glass composition in terms of mass %, 0.1 to 60% of $SiO_2+Al_2O_3+B_2O_3$, has a mass ratio $(BaO+La_2O_3+Nb_2O_5+TiO_2+ZrO_2)/(SiO_2+Al_2O_3+B_2O_3)$ of 0.1 to 50, a mass ratio $(MgO+CaO+SrO+BaO)/(BaO+La_2O_3+Nb_2O_5+TiO_2+ZrO_2)$ of 0 to 10, and a mass ratio $(TiO_2+ZrO_2)/(BaO+La_2O_3+Nb_2O_5)$ of 0.001 to 40, and has a refractive index nd of 1.55 to 2.3. With this, the high refractive index glass is likely to have a refractive index matching that of an organic light-emitting element and that of an ITO film, and the denitrification resistance of the high refractive index glass is likely to be enhanced.

Herein, the "refractive index nd" can be measured with a refractometer, and can be measured, for example, by producing samples having a rectangular parallelepiped shape of 25 mm by 25 mm by about 3 mm, then subjecting the samples to annealing treatment at a cooling rate of 0.1° C./min in the temperature range from (annealing point Ta+30° C.) to (strain point Ps−50° C.), and subsequently measuring the refractive index with a refractometer KPR-200 manufactured by Kalnew Co., Ltd. in a state in which an immersion liquid having a refractive index matching to that of the samples is immersed between two glass samples. The term "annealing point Ta" refers to a value obtained by measurement based on a method as described in ASTM C338-93. Further, the term "$SiO_2+Al_2O_3+B_2O_3$" refers to the total amount of $SiO_2$, $Al_2O_3$, and $B_2O_3$. The term "$BaO+La_2O_3+Nb_2O_5+TiO_2+ZrO_2$" refers to the total amount of BaO, $La_2O_3$, $Nb_2O_5$, $TiO_2$, and $ZrO_2$. The term "MgO+CaO+SrO+BaO" refers to the total amount of MgO, CaO, SrO, and BaO. The term "$TiO_2+ZrO_2$" refers to the total amount of $TiO_2$ and $ZrO_2$. The term "$BaO+La_2O_3+Nb_2O_5$" refers to the total amount of BaO, $La_2O_3$, and $Nb_2O_5$.

Second, the high refractive index glass according to the first invention preferably has a liquidus viscosity of $10^{3.0}$ dPa·s or more. Herein, the term "liquidus viscosity" refers to a value obtained by measuring the viscosity of glass at its liquidus temperature by a platinum sphere pull up method. The term "liquidus temperature" refers to a value obtained by measuring a temperature at which crystals of glass deposit after glass powder that has passed through a standard 30-mesh sieve (500 μm) and remained on a 50-mesh sieve (300 μm) is placed in a platinum boat and kept in a gradient heating furnace for 24 hours.

An OLED lighting device or the like has involved a problem in that the density of an electric current at the time of the application of the electric current varies depending on a slight difference in surface smoothness of a glass sheet, causing the unevenness of the intensity of illumination. Further, when the surfaces of a glass sheet are polished to increase its surface smoothness, a problem occurs in that the processing cost of the glass sheet surges. Thus, when the liquidus viscosity of a high refractive index glass is controlled to a value in the above-mentioned range, the glass can be easily formed by an overflow down-draw method, and consequently, a glass sheet having good surface smoothness can be easily manufactured even if its surfaces are not polished. Herein, the term "overflow down-draw method" refers to a method comprising causing molten glass to overflow from both sides of a heat-resistant, trough-shaped structure, and subjecting the overflowing molten glass to down-draw downward while joining the flows of the overflowing molten glass at the lower end of the trough-shaped structure, to thereby form the molten glass into a glass sheet.

Third, the high refractive index glass according to the first invention preferably has a sheet shape. With this, the high refractive index glass is easily applicable to a substrate for various devices such as an OLED display, an OLED lighting device, and a dye-sensitized solar cell. Note that the "sheet shape" comprises a film shape having a small thickness.

Fourth, the high refractive index glass according to the first invention is preferably formed by an overflow down-draw method or a slot down-draw method. Herein, the term "slot down-draw method" refers to a method of forming a glass sheet by down-drawing molten glass downward while pouring the molten glass from apertures having a substantially rectangular shape.

Fifth, the high refractive index glass according to the first invention preferably comprises at least one unpolished surface, the unpolished surface having a surface roughness Ra of 10 Å or less. Herein, the term "surface roughness Ra" refers to a value obtained by measurement using a method in accordance with JIS B0601: 2001.

Sixth, the high refractive index glass according to the first invention is preferably used in a lighting device.

Seventh, the high refractive index glass according to the first invention is preferably used in an OLED lighting device.

Eighth, the high refractive index glass according to the first invention is preferably used in an organic solar cell, in particular, a dye-sensitized solar cell.

Ninth, the high refractive index glass according to the first invention is preferably used in an OLED display.

The inventors of the present invention have made extensive studies, and have consequently found that the above-mentioned technical object can be achieved by restricting a glass composition range and glass characteristics within predetermined ranges. The finding is proposed as a second invention. That is, a high refractive index glass according to the second invention comprises, as a glass composition in terms of mass %, 5 to 50% of $SiO_2$ and 20 to 50% of $SiO_2+Al_2O_3+B_2O_3$, has a mass ratio $(BaO+La_2O_3+Nb_2O_5+TiO_2+ZrO_2)/(SiO_2+Al_2O_3+B_2O_3)$ of 0.1 to 5, a mass ratio $(MgO+CaO+SrO+BaO)/(BaO+La_2O_3+Nb_2O_5+TiO_2+ZrO_2)$ of 0.1 to 1.5, and a mass ratio $(TiO_2+ZrO_2)/(BaO+La_2O_3+Nb_2O_5)$ of 0.05 to 2, and has a refractive index nd of 1.6 to 2.2.

The inventors of the present invention have made extensive studies, and have consequently found that the above-mentioned technical object can be achieved by restricting glass characteristics within a predetermined range. The finding is proposed as a third invention. That is, a high refractive index glass according to the third invention has a sheet shape and has a refractive index nd of 1.6 or more, a liquidus viscosity of $10^{4.0}$ dPa·s or more, a surface roughness Ra of at least one surface of 10 Å or less, and a thickness of 0.1 to 1.0 mm.

The inventors of the present invention have made extensive studies, and have consequently found that the above-mentioned technical object can be achieved by restricting a glass composition range and glass characteristics within predetermined ranges. The finding is proposed as a fourth invention. That is, a high refractive index glass according to the fourth invention comprises, as a glass composition in terms of mass %, 10 to 60% of $SiO_2$, 0 to 5% of $B_2O_3$, 0.1 to 60% of BaO, 0.1 to 40% of $La_2O_3+Nb_2O_5$, and 0 to 10% of $Li_2O+Na_2O+K_2O$, has a value for a mass ratio $(MgO+CaO)/(SrO+BaO)$ of 0 to 0.5, and has a strain point of 600° C. or more and a refractive index nd of 1.55 to 2.3. With this, the high refractive index glass is likely to have a refractive index matching that of an organic light-emitting element and that of an ITO film, and the heat resistance of the high refractive index glass is likely to be enhanced. In addition, the denitrification resistance of the high refractive index glass is likely to be enhanced, and the high refractive index glass is likely to have a thermal expansion coefficient matching that of a transparent conductive film such as an ITO or FTO film.

By the way, a display (such as an OLED display) in which an OLED light-emitting element is used is mainly driven by a p-Si·TFT, from the viewpoints of the mobility of electrons and the characteristics of a TFT. The production process of a p-Si·TFT comprises the step of heat treatment at 400 to 600° C. In the step of heat treatment, slight dimensional shrinkage called heat shrinkage occurs in glass, causing pixel pitch shift in the resultant TFT, with the result that display defects may be caused. In recent years, a multi-view type 3D display has been developed, and hence, in order to provide a natural stereoscopic image, it has been particularly required to develop a high-resolution display with a resolution of 2K to 4K or more. As the resolution of a display is higher, even dimensional shrinkage of about several ppms may lead to the occurrence of display defects. However, each kind of conventional high refractive index glass has had a problem in that the heat resistance of the high refractive index glass is insufficient, and hence, when high-temperature heat treatment is applied to the high refractive index glass, the glass is liable to have heat shrinkage causing display defects. On the other hand, the heat resistance of the high refractive index glass according to the fourth invention can be easily enhanced as mentioned above, and hence the problem described above can be solved at the same time.

Herein, the term "strain point" refers to a value obtained by measurement based on a method as described in ASTM C336-71. The "refractive index nd" can be measured with a refractometer, and can be measured, for example, by producing samples having a rectangular parallelepiped shape of 25 mm by 25 mm by about 3 mm, then subjecting the samples to annealing treatment at a cooling rate of 0.1° C./min in the temperature range from (annealing point Ta+30° C.) to (strain point-50° C.), and subsequently using a refractometer KPR-200 manufactured by Kalnew Co., Ltd. in a state in which an immersion liquid having a refractive index matching to that of the samples is immersed between two glass samples. The term "annealing point Ta" refers to a value obtained by measurement based on a method as described in ASTM C338-93. Further, the term "$La_2O_3+Nb_2O_5$" refers to the total amount of $La_2O_3$ and $Nb_2O_5$. The term "$Li_2O+Na_2O+K_2O$" refers to the total amount of $Li_2O$, $Na_2O$, and $K_2O$. The term "MgO+CaO" refers to the total amount of MgO and CaO. The term "SrO+BaO" refers to the total amount of SrO and BaO.

Second, the high refractive index glass according to the fourth invention preferably has a liquidus viscosity of $10^{3.0}$ dPa·s or more. Herein, the term "liquidus viscosity" refers to a value obtained by measuring the viscosity of glass at its liquidus temperature by a platinum sphere pull up method. The term "liquidus temperature" refers to a value obtained by measuring a temperature at which crystals of glass deposit after glass powder that has passed through a standard 30-mesh sieve (500 μm) and remained on a 50-mesh sieve (300 μm) is placed in a platinum boat and kept in a gradient heating furnace for 24 hours.

An OLED lighting device or the like has involved a problem in that the density of an electric current at the time of the application of the electric current varies depending on a slight difference in surface smoothness of a glass sheet, causing the unevenness of the intensity of illumination. Further, when the surfaces of a glass sheet are polished to increase its surface smoothness, a problem occurs in that the processing cost of the glass sheet surges. Thus, when the liquidus viscosity of a high refractive index glass is controlled to a value in the above-mentioned range, the glass can be easily formed by an overflow down-draw method, and consequently, a glass sheet having good surface smoothness can be easily manufactured even if its surfaces are not polished.

Third, the high refractive index glass according to the fourth invention preferably comprises, as a glass composition in terms of mass %, 15 to 60% of $SiO_2$, 0 to 5% of $B_2O_3$, 0.1 to 40% of BaO, 0.1 to 30% of $La_2O_3+Nb_2O_5$, and 0 to 5% of $Li_2O+Na_2O+K_2O$, has a value for a mass ratio $(MgO+CaO)/(SrO+BaO)$ of 0 to 0.5, and has a strain point of 630° C. or more and a refractive index nd of 1.55 to 2.2.

Fourth, the high refractive index glass of the fourth invention preferably comprises, as a glass composition in terms of mass %, 20 to 60% of $SiO_2$, 0 to 5% of $B_2O_3$, 5 to 40% of BaO, 0.1 to 25% of $La_2O_3+Nb_2O_5$, and 0 to 3% of $Li_2O+Na_2O+K_2O$, has a value for a mass ratio $(MgO+CaO)/(SrO+BaO)$ of 0 to 0.4, and has a strain point of 650° C. or more and a refractive index nd of 1.55 to 2.1.

Fifth, the high refractive index glass according to the fourth invention preferably has a density of 4.0 g/cm³ or less. The "density" can be measured by a well-known Archimedes method.

Sixth, the high refractive index glass according to the fourth invention preferably has a sheet shape. With this, the high refractive index glass is easily applicable to a substrate for various devices such as an OLED display, an OLED lighting device, and a dye-sensitized solar cell. Note that the "sheet shape" comprises a film shape having a small thickness.

Seventh, the high refractive index glass of the fourth invention is preferably formed by an overflow down-draw method or a slot down-draw method. Herein, the term "overflow down-draw method" refers to a method comprising causing molten glass to overflow from both sides of a heat-resistant, trough-shaped structure, and subjecting the overflowing molten glass to down-draw downward while joining the flows of the overflowing molten glass at the lower end of the trough-shaped structure, to thereby form the molten glass into a glass sheet. Further, the term "slot down-draw method" refers to a method of forming a glass sheet by down-drawing molten glass downward while pouring the molten glass from apertures having a substantially rectangular shape.

Eighth, the high refractive index glass according to the fourth invention preferably comprises at least one unpolished surface, the unpolished surface having a surface roughness Ra of 10 Å or less. Herein, the term "surface roughness Ra" refers to a value obtained by measurement using a method in accordance with JIS B0601: 2001.

Ninth, the high refractive index glass according to the fourth invention is preferably used in a lighting device.

Tenth, the high refractive index glass according to the fourth invention is preferably used in an OLED lighting device.

Eleventh, the high refractive index glass according to the fourth invention is preferably used in an organic solar cell.

Twelfth, the high refractive index glass according to the fourth invention is preferably used in an OLED display.

The inventors of the present invention have made extensive studies, and have consequently found that the above-mentioned technical object can be achieved by restricting a glass composition range and glass characteristics within predetermined ranges. The finding is proposed as a fifth invention. That is, a high refractive index glass according to the fifth invention comprises, as a glass composition in terms of mass %, 25 to 60% of $SiO_2$, 0 to 5% of $B_2O_3$, 20 to 40% of BaO, 0.1 to 10% of $La_2O_2$, 0.1 to 10% of $Nb_2O_5$, 0.1 to 20% of $La_2O_3+Nb_2O_5$, and 0 to 0.1% of $Li_2O+Na_2O+K_2O$, has a value for a mass ratio (MgO+CaO)/(SrO+BaO) of 0 to 0.2, and has a refractive index nd of 1.55 to 2.0.

The inventors of the present invention have made extensive studies, and have consequently found that the above-mentioned technical object can be achieved by restricting glass characteristics within a predetermined range. The finding is proposed as a sixth invention. That is, a high refractive index glass according to the sixth invention has a sheet shape, is substantially free of PbO, and has a refractive index nd of 1.55 to 2.0, a strain point of 630° C. or more, a liquidus viscosity of $10^4$ dPa·s or more, a thermal expansion coefficient at 30 to 380° C. of $45 \times 10^{-7}$/° C. to $95 \times 10^{-7}$/° C., a thickness of 0.05 to 1.5 mm, and a surface roughness Ra of at least one surface of 30 Å or less. Herein, the phrase "substantially free of PbO" refers to the case where the content of PbO in a glass composition is less than 1,000 ppm (by mass). The "thermal expansion coefficient at 30 to 380° C." can be measured with a dilatometer.

The inventors of the present invention have made extensive studies, and have consequently found that the above-mentioned technical object can be achieved by restricting a glass composition range and glass characteristics within predetermined ranges. The finding is proposed as a seventh invention. That is, a high refractive index glass according to the seventh invention comprises, as a glass composition in terms of mass %, 20 to 70% of $SiO_2+Al_2O_3+B_2O_3$, 20 to 70% of $SiO_2$, 0 to 30% of $B_2O_3$, 0 to 50% of MgO+CaO+SrO+BaO, and 0 to 30% of $BaO+La_2O_3+Nb_2O_5+ZrO_2+TiO_2$, has a molar ratio $B_2O_3/SiO_2$ of 0 to 1, a molar ratio $SiO_2/(MgO+CaO+SrO+BaO+La_2O_3+Nb_2O_5)$ of 0.1 to 6, and a molar ratio $(MgO+CaO+SrO+BaO)/(MgO+CaO+SrO+BaO+La_2O_3+Nb_2O_5+Gd_2O_3)$ of 0.1 to 0.99, and has a refractive index of 1.55 to 2.3. With this, the high refractive index glass is likely to have a refractive index matching that of an organic light-emitting element and that of an ITO film, the denitrification resistance of the high refractive index glass is likely to be improved, and the density thereof is likely to reduce.

Herein, the "refractive index nd" can be measured with a refractometer, and can be measured, for example, by producing samples having a rectangular parallelepiped shape of 25 mm by 25 mm by about 3 mm, then subjecting the samples to annealing treatment at a cooling rate of 0.1° C./min in the temperature range from (annealing point Ta+30° C.) to (strain point-50° C.), and subsequently using a refractometer KPR-200 manufactured by Kalnew Co., Ltd. in a state in which an immersion liquid having a refractive index matching to that of the samples is immersed between two glass samples. The term "annealing point Ta" refers to a value obtained by measurement based on a method as described in ASTM C338-93. Further, the term "$SiO_2+Al_2O_3+B_2O_3$" refers to the total amount of $SiO_2$, $Al_2O_3$, and $B_2O_3$. The term "MgO+CaO+SrO+BaO" refers to the total amount of MgO, CaO, SrO, and BaO. The term "$BaO+La_2O_3+Nb_2O_5+ZrO_2+TiO_2$" refers to the total amount of BaO, $La_2O_3$, $Nb_2O_5$, $ZrO_2$, and $TiO_2$. The term "$MgO+CaO+SrO+BaO+La_2O_3+Nb_2O_5$" refers to the total amount of MgO, CaO, SrO, BaO, $La_2O_3$, and $Nb_2O_5$. The term "$MgO+CaO+SrO+BaO+La_2O_3+Nb_2O_5+Gd_2O_3$" refers to the total amount of MgO, CaO, SrO, BaO, $La_2O_3$, $Nb_2O_5$, and $Gd_2O_3$.

Second, the high refractive index glass according to the seventh invention preferably has a liquidus viscosity of $10^{3.0}$ dPa·s or more. Herein, the term "liquidus viscosity" refers to a value obtained by measuring the viscosity of glass at its liquidus temperature by a platinum sphere pull up method. The term "liquidus temperature" refers to a value obtained by measuring a temperature at which crystals of glass deposit after glass powder that has passed through a standard 30-mesh sieve (500 μm) and remained on a 50-mesh sieve (300 μm) is placed in a platinum boat and kept in a gradient heating furnace for 24 hours.

An OLED lighting device or the like has involved a problem in that the density of an electric current at the time of the application of the electric current varies depending on a slight difference in surface smoothness of a glass sheet, causing the unevenness of the intensity of illumination. Further, when the surfaces of a glass sheet are polished to increase its surface smoothness, a problem occurs in that the processing cost of the glass sheet surges. Thus, when the liquidus viscosity of a high refractive index glass is controlled to a value in the above-mentioned range, the glass can be easily formed by an overflow down-draw method, and consequently, a glass sheet having good surface smoothness can be easily manufactured even if its surfaces are not polished. Herein, the term "overflow down-draw method" refers to a method comprising causing molten glass to overflow from both sides of a heat-resistant, trough-shaped structure, and subjecting the overflowing molten glass to down-draw downward while joining the flows of the overflowing molten glass at the lower end of the trough-shaped structure, to thereby form the molten glass into a glass sheet.

Third, the high refractive index glass according to the seventh invention preferably comprises, as a glass composition in terms of mol %, 30 to 70% of $SiO_2+Al_2O_3+B_2O_3$, 30 to 70% of $SiO_2$, 0 to 15% of $B_2O_3$, 5 to 45% of $MgO+CaO+SrO+BaO$, and 15 to 30% of $BaO+La_2O_3+Nb_2O_5+ZrO_2+TiO_2$, has a molar ratio $B_2O_3/SiO_2$ of 0 to 1, a molar ratio $SiO_2/(MgO+CaO+SrO+BaO+La_2O_3+Nb_2O_5)$ of 0.5 to 5, and a molar ratio $(MgO+CaO+SrO+BaO)/(MgO+CaO+SrO+BaO+La_2O_3+Nb_2O_5+Gd_2O_3)$ of 0.3 to 0.99, and has a refractive index of 1.55 to 2.3.

Fourth, the high refractive index glass according to the seventh invention preferably comprises, as a glass composition in terms of mol %, 40 to 70% of $SiO_2+Al_2O_3+B_2O_3$, 40 to 70% of $SiO_2$, 0 to 10% of $B_2O_3$, 10 to 40% of $MgO+CaO+SrO+BaO$, and 15 to 25% of $BaO+La_2O_3+Nb_2O_5+ZrO_2+TiO_2$, has a molar ratio $B_2O_3/SiO_2$ of 0 to 1, a molar ratio $SiO_2/(MgO+CaO+SrO+BaO+La_2O_3+Nb_2O_5)$ of 1 to 3, and a molar ratio $(MgO+CaO+SrO+BaO)/(MgO+CaO+SrO+BaO+La_2O_3+Nb_2O_5+Gd_2O_3)$ of 0.5 to 0.99, and has a refractive index of 1.55 to 2.3.

Fifth, the high refractive index glass according to the seventh invention preferably has a density of 4.5 g/cm³ or less. OLED lighting devices comprise a type of lighting device inserted into a ceiling and a type of lighting device hung from a ceiling. Thus, it is required to develop a lighter device for the purpose of reducing the work load. Then, when a high refractive index glass having a density in the above-mentioned range is invented, the high refractive index glass is likely to meet the requirement described above. Herein, the "density" can be measured by a well-known Archimedes method.

Sixth, the high refractive index glass according to the seventh invention is preferably formed by an overflow down-draw method or a slot down-draw method. Herein, the term "slot down-draw method" refers to a method of forming a glass sheet by down-drawing molten glass downward while pouring the molten glass from apertures having a substantially rectangular shape.

Seventh, the high refractive index glass according to the seventh invention is preferably used in a lighting device.

Eighth, the high refractive index glass according to the seventh invention is preferably used in an OLED lighting device.

Ninth, the high refractive index glass according to the seventh invention is preferably used in an organic solar cell.

Tenth, the high refractive index glass according to the seventh invention is preferably used in an OLED display.

The inventors of the present invention have made extensive studies, have consequently found that the technical object can be achieved by regulating a glass composition range and glass characteristics within predetermined ranges. The finding is proposed as an eighth invention. That is, a high refractive index glass according to the eighth invention comprises, as a glass composition in terms of mol %, 60 to 70% of $SiO_2+Al_2O_3+B_2O_3$, 60 to 70% of $SiO_2$, 0 to 1% of $B_2O_3$, 25 to 30% of $MgO+CaO+SrO+BaO$, and 15 to 25% of $BaO+La_2O_3+Nb_2O_5+ZrO_2+TiO_2$, has a molar ratio $B_2O_3/SiO_2$ of 0 to 0.1, a molar ratio $SiO_2/(MgO+CaO+SrO+BaO+La_2O_3+Nb_2O_5)$ of 1.5 to 2.5, and a molar ratio $(MgO+CaO+SrO+BaO)/(MgO+CaO+SrO+BaO+La_2O_3+Nb_2O_5+Gd_2O_3)$ of 0.8 to 0.99, and has a refractive index of 1.55 to 2.3 and a density of 4.5 g/cm³ or less.

The inventors of the present invention have made extensive studies, and have consequently found that the above-mentioned technical object can be achieved by restricting glass characteristics within a predetermined range. The finding is proposed as a ninth invention. That is, a high refractive index glass according to the ninth invention is free of PbO and has a refractive index of 1.55 to 2.0, a liquidus viscosity of $10^{3*0}$ dPa·s or more, and a density of 4.0 g/cm³ or less.

Advantageous Effect of Invention

According to the present invention described above, it is possible to provide the high refractive index glass which can have a refractive index matching that of an organic light-emitting element and that of an ITO film.

DESCRIPTION OF EMBODIMENTS

First Embodiment

One embodiment of the first invention (hereinafter, referred to as first embodiment) is described. Note that the first embodiment also serves as embodiments of the second invention and the third invention.

A high refractive index glass according to the first embodiment comprises, as a glass composition in terms of mass %, 0.1 to 60% of $SiO_2+Al_2O_3+B_2O_3$, and has a mass ratio $(BaO+La_2O_3+Nb_2O_5+TiO_2+ZrO_2)/(SiO_2+Al_2O_3+B_2O_3)$ of 0.1 to 50, a mass ratio $(MgO+CaO+SrO+BaO)/(BaO+La_2O_3+Nb_2O_5+TiO_2+ZrO_2)$ of 0 to 10, and a mass ratio $(TiO_2+ZrO_2)/(BaO+La_2O_3+Nb_2O_5)$ of 0.001 to 40. The reasons why the content ranges of the components are limited as described above are described below. Note that in the following descriptions of the content ranges, the expression "%" refers to "mass %" unless otherwise stated.

The content of $SiO_2+Al_2O_3+B_2O_3$ is 0.1 to 60%. When the content of $SiO_2+Al_2O_3+B_2O_3$ decreases, it is difficult to form a glass network structure, resulting in difficulty in vitrification. Further, the viscosity of the glass excessively lowers and hence it is difficult to ensure a high liquidus viscosity. Thus, the content of $SiO_2+Al_2O_3+B_2O_3$ is 0.1% or more, preferably 5% or more, 10% or more, 12% or more, 15% or more, 20% or more, 25% or more, 28% or more, 35% or more, particularly preferably 40% or more. On the other hand, when the content of $SiO_2+Al_2O_3+B_2O_3$ increases, the meltability and formability are liable to lower, and the refractive index nd is liable to lower. Thus, the content of $SiO_2+Al_2O_3+B_2O_3$ is 60% or less, preferably 55% or less, 53% or less, 50% or less, 49% or less, 48% or less, particularly preferably 45% or less.

The mass ratio $(BaO+La_2O_3+Nb_2O_5+TiO_2+ZrO_2)/(SiO_2+Al_2O_3+B_2O_3)$ is 0.1 to 50. When the mass ratio $(BaO+La_2O_3+Nb_2O_5+TiO_2+ZrO_2)/(SiO_2+Al_2O_3+B_2O_3)$ decreases, it is difficult to increase the refractive index nd. Thus, the lower limit value for the mass ratio $(BaO+La_2O_3+Nb_2O_5+TiO_2+ZrO_2)/(SiO_2+Al_2O_3+B_2O_3)$ is 0.1 or more, preferably 0.2 or more, 0.3 or more, 0.5 or more, 0.6 or more, particularly preferably 0.7 or more. On the other hand, when the mass ratio $(BaO+La_2O_3+Nb_2O_5+TiO_2+ZrO_2)/(SiO_2+Al_2O_3+B_2O_3)$ increases, vitrification becomes difficult, and the viscosity of the glass excessively lowers and hence it is difficult to ensure a high liquidus viscosity. Thus, the upper limit value for the mass ratio $(BaO+La_2O_3+Nb_2O_5+TiO_2+ZrO_2)/(SiO_2+Al_2O_3+B_2O_3)$ is 50 or less, preferably 30 or less, 20 or less, 10 or less, 5 or less, 3 or less, 2 or less, 1.8 or less, 1.6 or less, 1.3 or less, 1.1 or less, particularly preferably 1.0 or less.

The mass ratio $(MgO+CaO+SrO+BaO)/(BaO+La_2O_3+Nb_2O_5+TiO_2+ZrO_2)$ is 0 to 10. When the mass ratio $((MgO+CaO+SrO+BaO)/(BaO+La_2O_3+Nb_2O_5+TiO_2+ZrO_2)$ increases, devitrification resistance improves. However, when the value for the mass ratio is more than 10, the glass composition loses its balance. As a result, the devitrification resistance may lower to the worse and the refractive index nd may lower. Thus, the mass ratio (MgO+CaO+SrO+BaO)/(BaO+La$_2$O$_3$+Nb$_2$O$_5$+TiO$_2$+ZrO$_2$) is 10 or less, preferably 5 or less, 3 or less, 2 or less, 1.5 or less, 1.4 or less, 1.3 or less, 1.2 or less, 1.1 or less, particularly preferably or less. Note that when the mass ratio (MgO+CaO+SrO+BaO)/(BaO+La$_2$O$_3$+Nb$_2$O$_5$+TiO$_2$+ZrO$_2$) decreases, the devitrification resistance is liable to lower. Thus, the mass ratio (MgO+CaO+SrO+BaO)/(BaO+La$_2$O$_3$+Nb$_2$O$_5$+TiO$_2$+ZrO$_2$) is preferably 0.1 or more, 0.3 or more, 0.4 or more, 0.5 or more, 0.6 or more, particularly preferably 0.7 or more.

The mass ratio (TiO$_2$+ZrO$_2$)/(BaO+La$_2$O$_3$+Nb$_2$O$_5$) is 0.001 to 40. When the mass ratio (TiO$_2$+ZrO$_2$)/(BaO+La$_2$O$_3$+Nb$_2$O$_5$) decreases, it is difficult to ensure a high liquidus viscosity and it is difficult to increase the refractive index nd. Thus, the mass ratio (TiO$_2$+ZrO$_2$)/(BaO+La$_2$O$_3$+Nb$_2$O$_5$) is 0.001 or more, preferably 0.005 or more, 0.01 or more, 0.05 or more, 0.1 or more, 0.15 or more, 0.18 or more, particularly preferably 0.2 or more. On the other hand, when the mass ratio (TiO$_2$+ZrO$_2$)/(BaO+La$_2$O$_3$+Nb$_2$O$_5$) increases, it becomes easy to ensure a high liquidus viscosity while maintaining a high refractive index. However, when the mass ratio (TiO$_2$+ZrO$_2$)/(BaO+La$_2$O$_3$+Nb$_2$O$_5$) is more than 40, the glass composition loses its balance. As a result, the liquidus viscosity is liable to lower to the worse. Thus, the mass ratio (TiO$_2$+ZrO$_2$)/(BaO+La$_2$O$_3$+Nb$_2$O$_5$) is 40 or less, preferably 25 or less, 13 or less, 10 or less, 7 or less, 5 or less, 2 or less, 1.6 or less, 1.3 or less, 1 or less, 0.8 or less, particularly preferably 0.5 or less.

The content of SiO$_2$ is preferably 0.1 to 60%. When the content of SiO$_2$ decreases, it is difficult to form a glass network structure, resulting in difficulty in vitrification. Further, the viscosity of the glass excessively lowers and hence it is difficult to ensure a high liquidus viscosity. Thus, the content of SiO$_2$ is preferably 0.1% or more, 3% or more, 5% or more, 10% or more, 12% or more, 15% or more, 20% or more, 25% or more, 28% or more, 35% or more, particularly preferably 40% or more. On the other hand, when the content of SiO$_2$ increases, the meltability and formability are liable to lower, and the refractive index nd is liable to lower. Thus, the content of SiO$_2$ is preferably 60% or less, 55% or less, 53% or less, 52% or less, 50% or less, 49% or less, 48% or less, particularly preferably 45% or less.

The content of Al$_2$O$_3$ is preferably 0 to 20%. When the content of Al$_2$O$_3$ increases, devitrified crystals are liable to deposit in glass, the liquidus viscosity is liable to lower, and the refractive index nd is liable to lower. Thus, the content of Al$_2$O$_3$ is preferably 20% or less, 15% or less, 10% or less, 8% or less, particularly preferably 6% or less. Note that when the content of Al$_2$O$_3$ decreases, the glass composition loses a balance among the components, and the glass is liable to denitrify to the worse. Thus, the content of Al$_2$O$_3$ is preferably 0.1% or more, 0.5% or more, particularly preferably 1% or more.

The content of B$_2$O$_3$ is preferably 0 to 10%. When the content of B$_2$O$_3$ increases, the refractive index nd and Young's modulus are liable to lower. Thus, the content of B$_2$O$_3$ is preferably 10% or less, 8% or less, 4% or less, less than 2%, particularly preferably less than 1%.

MgO is a component that increases the refractive index nd, Young's modulus, and strain point and a component that reduces the viscosity. However, when MgO is contained in a large amount, the liquidus temperature rises, with the result that the denitrification resistance may deteriorate, and the density and thermal expansion coefficient may become too high. Thus, the content of MgO is preferably 10% or less, 5% or less, 3% or less, 2% or less, 1.5% or less, 1% or less, particularly preferably 0.5% or less.

The content of CaO is preferably 0 to 15%. When the content of CaO increases, the density and thermal expansion coefficient tend to increase. Further, when the content of CaO is more than 15%, the glass composition loses its balance, with the result that the devitrification resistance is liable to lower. Thus, the content of CaO is preferably 15% or less, 12% or less, 10% or less, 9% or less, particularly preferably 8.5% or less. Note that when the content of CaO decreases, the meltability deteriorates, the Young's modulus lowers, and the refractive index nd is liable to lower. Thus, the content of CaO is preferably 0.5% or more, 1% or more, 2% or more, 3% or more, particularly preferably 5% or more.

The content of SrO is preferably 0 to 15%. When the content of SrO increases, the refractive index nd, density, and thermal expansion coefficient tend to increase. When the content of SrO is more than 15%, the glass composition loses a balance among the components, with the result that the devitrification resistance is liable to lower. Thus, the content of SrO is preferably 15% or less, 12% or less, 10% or less, 9% or less, 8% or less, particularly preferably 7% or less. Note that when the content of SrO decreases, the meltability is liable to lower and the refractive index nd is liable to lower. Thus, the content of SrO is 0.5% or more, 1% or more, 2% or more, 3% or more, particularly preferably 3.5% or more.

The content of MgO+CaO+SrO is preferably 0 to 50% in order to maintain a high liquidus viscosity while increasing the refractive index nd. When the content of MgO+CaO+SrO increases, it is difficult to ensure a high liquidus viscosity. Thus, the content of MgO+CaO+SrO is preferably 50% or less, 45% or less, 30% or less, 20% or less, particularly preferably 16% or less. Note that when the content of MgO+CaO+SrO decreases, it is difficult to increase the refractive index nd. Thus, the content of MgO+CaO+SrO is preferably 5% or more, 8% or more, 10% or more, particularly preferably 11% or more. Herein, the term "MgO+CaO+SrO" refers to the total amount of MgO, CaO, and SrO.

Among alkaline-earth metal oxides, BaO is a component that increases the refractive index nd of glass without reducing the viscosity extremely. The content of BaO is preferably 0 to 50%. When the content of BaO increases, the refractive index nd, density, and thermal expansion coefficient tend to increase. However, when the content of BaO is more than 50%, the glass composition loses a balance among the components, with the result that the denitrification resistance is liable to lower. Thus, the content of BaO is preferably 50% or less, 40% or less, 35% or less, 32% or less, 30% or less, 29.5% or less, 29% or less, particularly preferably 28% or less. Note that when the content of BaO decreases, it is difficult to obtain a desired refractive index nd and it is difficult to ensure a high liquidus viscosity. Thus, the content of BaO is preferably 0.5% or more, 1% or more, 2% or more, 5% or more, 10% or more, 15% or more, 23% or more, particularly preferably 25% or more.

La$_2$O$_3$ is a component that increases the refractive index nd. When the content of La$_2$O$_3$ increases, the density and thermal expansion coefficient become too high, and the devitrification resistance is liable to lower. Thus, the content range of La$_2$O$_3$ is suitably 0 to 25%, 0 to 22%, 0.1 to 18%, 1 to 14%, 2 to 12%, particularly suitably 3 to 10%.

Nb$_2$O$_5$ is a component that increases the refractive index nd. When the content of Nb$_2$O$_5$ increases, the density and thermal expansion coefficient become too high, and the devitrification resistance is liable to lower. Thus, the content range of Nb$_2$O$_5$ is suitably 0 to 25%, 0 to 22%, 0.1 to 18%, 1 to 14%, 2 to 12%, particularly suitably 3 to 10%.

TiO$_2$ is a component that increases the refractive index nd. When the content of TiO$_2$ increases, the devitrification resistance is liable to lower. Thus, the content range of $TiO_2$ is suitably 0 to 25%, 0.1 to 22%, 1 to 18%, 2 to 14%, 3 to 12%, particularly suitably 4 to 10%.

$ZrO_2$ is a component that increases the refractive index nd. When the content of $ZrO_2$ increases, the devitrification resistance is liable to lower. Thus, the content range of $ZrO_2$ is suitably 0 to 25%, 0 to 20%, 0.1 to 10%, 0.1 to 8%, 0.1 to 6%, particularly suitably 0.1 to 5%.

When $BaO+La_2O_3+Nb_2O_5+TiO_2+ZrO_2$ is added in a predetermined amount, the refractive index nd can be increased while suppressing the deterioration of the devitrification resistance. The content $BaO+La_2O_3+Nb_2O_5+TiO_2+ZrO_2$ is preferably 10% or more, 15% or more, 20% or more, 25% or more, 28% or more, 33% or more, particularly preferably 35% or more. On the other hand, when the content of $BaO+La_2O_3+Nb_2O_5+TiO_2+ZrO_2$ is too large, the denitrification resistance is liable to lower. Thus, the content of $BaO+La_2O_3+Nb_2O_5+TiO_2+ZrO_2$ is preferably 65% or less, 60% or less, 58% or less, 55% or less, 50% or less, 45% or less, particularly preferably 41% or less.

In addition to the above-mentioned components, the following components may be added as optional components.

$Li_2O+Na_2O+K_2O$ is a component that reduces the viscosity of glass and is a component that adjusts the thermal expansion coefficient. However, when $Li_2O+Na_2O+K_2O$ is contained in a large amount, the viscosity lowers excessively, with the result that it is difficult to keep the high liquidus viscosity. Thus, the content of $Li_2O+Na_2O+K_2O$ is preferably 15% or less, 10% or less, 5% or less, 2% or less, 1% or less, 0.5% or less, particularly preferably 0.1% or less. Note that the content of each of $Li_2O$, $Na_2O$, and $K_2O$ is preferably 10% or less, 8% or less, 5% or less, 2% or less, 1% or less, 0.5% or less, particularly preferably 0.1% or less. Herein, the term "$Li_2O+Na_2O+K_2O$" refers to the total amount of $Li_2O$, $Na_2O$, and $K_2O$.

As a fining agent, one kind or two or more kinds selected from the group consisting of $As_2O_3$, $Sb_2O_3$, $CeO_2$, $SnO_2$, F, Cl, and $SO_3$ may be added in an amount of 0 to 3%. Note that it is preferred to use $As_2O_3$, $Sb_2O_3$, and F, in particular, $As_2O_3$ and $Sb_2O_3$ in an amount as small as possible from the environmental viewpoint, and each of the contents thereof is preferably less than 0.1%. In consideration of the above-mentioned points, $SnO_2$, $SO_3$, and Cl are each preferably used as the fining agent. In particular, the content of $SnO_2$ is preferably 0 to 1%, 0.01 to 0.5%, particularly preferably 0.05 to 0.4%. Further, the content of $SnO_2+SO_3+Cl$ is preferably 0 to 1%, 0.001 to 1%, 0.01 to 0.5%, particularly preferably 0.01 to 0.3%. Herein, the term "$SnO_2+SO_3+Cl$" refers to the total amount of $SnO_2$, $SO_3$, and Cl.

PbO is a component that reduces the viscosity, but is preferably used in an amount as small as possible from the environmental viewpoint. The content of PbO is preferably 0.5% or less, and it is desirable that glass be substantially free of PbO. Herein, the phrase "substantially free of PbO" refers to the case where the content of PbO in a glass composition is less than 1,000 ppm (by mass).

In the high refractive index glass according to the first embodiment, it is possible to construct suitable glass composition ranges by combining the suitable ranges of contents of the respective components. Of those, specific examples of the suitable glass composition ranges are as follows:

(1) comprising, as a glass composition in terms of mass %, 0.1 to 60% of $SiO_2+Al_2O_3+B_2O_3$ having a mass ratio $(BaO+La_2O_3+Nb_2O_5+TiO_2+ZrO_2)/(SiO_2+Al_2O_3+B_2O_3)$ of 0.1 to 30, a mass ratio $(MgO+CaO+SrO+BaO)/(BaO+La_2O_3+Nb_2O_5+TiO_2+ZrO_2)$ of 0 to 5, and a mass ratio $(TiO_2+ZrO_2)/(BaO+La_2O_3+Nb_2O_5)$ of 0.01 to 30, and having a refractive index nd of 1.6 to 2.2;

(2) comprising, as a glass composition in terms of mass %, 5 to 55% of $SiO_2+Al_2O_3+B_2O_3$, having a mass ratio $(BaO+La_2O_3+Nb_2O_5+TiO_2+ZrO_2)/(SiO_2+Al_2O_3+B_2O_3)$ of 0.1 to 20, a mass ratio $(MgO+CaO+SrO+BaO)/(BaO+La_2O_3+Nb_2O_5+TiO_2+ZrO_2)$ of 0 to 3, and a mass ratio $(TiO_2+ZrO_2)/(BaO+La_2O_3+Nb_2O_5)$ of 0.01 to 10, and having a refractive index nd of 1.55 to 2.3;

(3) comprising, as a glass composition in terms of mass %, 3 to 55% of $SiO_2$ and 10 to 55% of $SiO_2+Al_2O_3+B_2O_3$, having a mass ratio $(BaO+La_2O_3+Nb_2O_5+TiO_2+ZrO_2)/(SiO_2+Al_2O_3+B_2O_3)$ of 0.1 to 10, a mass ratio $(MgO+CaO+SrO+BaO)/(BaO+La_2O_3+Nb_2O_5+TiO_2+ZrO_2)$ of 0 to 1.5, and a mass ratio $(TiO_2+ZrO_2)/(BaO+La_2O_3+Nb_2O_5)$ of 0.05 to 5, and having a refractive index nd of 1.6 to 2.2;

(4) comprising, as a glass composition in terms of mass %, 5 to 52% of $SiO_2$ and 20 to 52% of $SiO_2+Al_2O_3+B_2O_3$, having a mass ratio $(BaO+La_2O_3+Nb_2O_5+TiO_2+ZrO_2)/(SiO_2+Al_2O_3+B_2O_3)$ of 0.1 to 5, a mass ratio $(MgO+CaO+SrO+BaO)/(BaO+La_2O_3+Nb_2O_5+TiO_2+ZrO_2)$ of 0.1 to 1.5, and a mass ratio $(TiO_2+ZrO_2)/(BaO+La_2O_3+Nb_2O_5)$ of 0.05 to 2, and having a refractive index nd of 1.6 to 2.2;

(5) comprising, as a glass composition in terms of mass %, 10 to 50% of $SiO_2$ and 20 to 50% of $SiO_2+Al_2O_3+B_2O_3$, having a mass ratio $(BaO+La_2O_3+Nb_2O_5+TiO_2+ZrO_2)/(SiO_2+Al_2O_3+B_2O_3)$ of 0.1 to 3, a mass ratio $(MgO+CaO+SrO+BaO)/(BaO+La_2O_3+Nb_2O_5+TiO_2+ZrO_2)$ of 0.3 to 1.4, and a mass ratio $(TiO_2+ZrO_2)/(BaO+La_2O_3+Nb_2O_5)$ of 0.05 to 1, and having a refractive index nd of 1.6 to 2.2;

(6) comprising, as a glass composition in terms of mass %, 10 to 50% of $SiO_2$ and 20 to 50% of $SiO_2+Al_2O_3+B_2O_3$, having a mass ratio $(BaO+La_2O_3+Nb_2O_5+TiO_2+ZrO_2)/(SiO_2+Al_2O_3+B_2O_3)$ of 0.2 to 1.8, a mass ratio $(MgO+CaO+SrO+BaO)/(BaO+La_2O_3+Nb_2O_5+TiO_2+ZrO_2)$ of 0.5 to 1.2, and a mass ratio $(TiO_2+ZrO_2)/(BaO+La_2O_3+Nb_2O_5)$ of 0.05 to 0.8, and having a refractive index nd of 1.6 to 2.2; and (7) comprising, as a glass composition in terms of mass %, 10 to 50% of $SiO_2$ and 20 to 50% of $SiO_2+Al_2O_3+B_2O_3$, having a mass ratio $(BaO+La_2O_3+Nb_2O_5+TiO_2+ZrO_2)/(SiO_2+Al_2O_3+B_2O_3)$ of 0.3 to 1.2, a mass ratio $(MgO+CaO+SrO+BaO)/(BaO+La_2O_3+Nb_2O_5+TiO_2+ZrO_2)$ of 0.7 to 1.1, and a mass ratio $(TiO_2+ZrO_2)/(BaO+La_2O_3+Nb_2O_5)$ of 0.05 to 0.5, and having a refractive index nd of 1.6 to 2.2.

The high refractive index glass according to the first embodiment has a refractive index nd of 1.55 or more, preferably 1.58 or more, 1.6 or more, 1.63 or more, 1.65 or more, 1.67 or more, 1.69 or more, 1.7 or more, particularly preferably 1.71 or more. When the refractive index nd is less than 1.55, light cannot be extracted efficiently because of the reflectance at the interface between an ITO film and the glass. On the other hand, when the refractive index nd is more than 2.3, the reflectance at the interface between air and the glass becomes higher, and hence it is difficult to enhance light extraction efficiency even if the surface of the glass is subjected to roughening treatment. Thus, the refractive index nd is 2.3 or less, preferably 2.2 or less, 2.1 or less, 2.0 or less, 1.9 or less, particularly preferably 1.75 or less.

The high refractive index glass according to the first embodiment has a liquidus temperature of preferably 1,200° C. or less, 1,150° C. or less, 1,130° C. or less, 1,110° C. or less, 1,090° C. or less, 1,070° C. or less, particularly preferably 1,050° C. or less. Further, the liquidus viscosity is preferably $10^{3.0}$ dPa·s or more, $10^{4.8}$ dPa·s or more, $10^{4.0}$ dPa·s or more, $10^{4.5}$ dPa·s or more, $10^{4.8}$ dPa·s or more, $10^{5.0}$ dPa·s or more, $10^{5.2}$ dPa·s or more, particularly preferably $10^{5.3}$ dPa·s or more. With this, the glass hardly devitrifies at the time of forming, and the glass is formed into a glass sheet by an overflow down-draw method.

The high refractive index glass according to the first embodiment preferably has a sheet shape, and has a thickness of preferably 1.5 mm or less, 1.3 mm or less, 1.1 mm or less, 0.8 mm or less, 0.6 mm or less, 0.5 mm or less, 0.3 mm or less, 0.2 mm or less, particularly preferably 0.1 mm or less. As the thickness becomes smaller, the flexibility increases, and a lighting device with excellent design can be easily produced. However, when the thickness becomes extremely small, the glass is liable to be damaged. Thus, the thickness is preferably 10 µm or more, particularly preferably 30 µm or more.

When the high refractive index glass according to the first embodiment has a sheet shape, the high refractive index glass preferably has at least one unpolished surface. The theoretical strength of glass is intrinsically very high. However, glass often breaks even by a stress far lower than the theoretical strength. This is because small defects called Griffith flaw are produced in the surfaces of the glass in some steps after the glass is formed into a glass sheet, such as a polishing step. Thus, when a surface of glass is not polished, the mechanical strength that the glass intrinsically has is not easily impaired, and hence the glass does not easily break. Further, when a surface of glass is not polished, the polishing step can be eliminated, and hence the production cost of the glass sheet can be reduced.

The high refractive index glass according to the first embodiment has at least one surface (provided that the surface is an effective surface) having a surface roughness Ra of preferably 10 Å or less, 5 Å or less, 3 Å or less, particularly preferably 2 Å or less. When the surface roughness Ra is more than 10 Å, the quality of an ITO film to be formed on the surface deteriorates and uniform light emission is not easily achieved.

The high refractive index glass according to the first embodiment is preferably formed by an overflow down-draw method. With this, an unpolished glass sheet having good surface quality can be produced. This is because when a glass sheet is formed by the overflow down-draw method, the surfaces that should serve as the surfaces of the glass sheet are formed in the state of a free surface without being brought into contact with a trough-shaped refractory. The structure and material of the trough-shaped structure are not particularly limited as long as the desired size and surface precision of the glass sheet can be achieved. Further, a method of applying a force to molten glass for down-drawing the molten glass downward is also not particularly limited. For example, it is possible to adopt a method comprising rotating a heat-resistant roll having a sufficiently large width in the state of being in contact with molten glass, to thereby draw the molten glass, or a method comprising bringing a plurality of pairs of heat-resistant rolls into contact with only the vicinity of the edge surfaces of molten glass, to thereby draw the molten glass.

A method other than the overflow down-draw method, such as a down-draw method (such as a slot down method or a re-draw method), a float method, or a roll-out method may also be adopted.

The high refractive index glass according to the first embodiment is preferably subjected to roughening treatment on one of its surfaces by HF etching, sandblasting, or the like. The surface roughness Ra of the roughening treated surface is preferably 10 Å or more, 20 Å or more, 30 Å or more, particularly preferably 50 Å or more. When the roughening treated surface is arranged on the side to be brought into contact with air of an OLED lighting device or the like, because the roughening treated surface has a non-reflective structure, light produced in an organic light-emitting layer does not easily return into the organic light-emitting layer. As a result, light extraction efficiency can be enhanced. Further, irregularities may be provided in a surface of glass by thermal processing such as re-pressing. With this, a precise reflective structure can be formed in the surface of the glass. The interval and depth of the irregularities are recommended to be adjusted in consideration of the refractive index nd of the glass. Further, a resin film with irregularities may be attached on a surface of glass.

When the roughening treatment is performed by atmospheric plasma processing, while the surface condition of one surface of a glass sheet is maintained, the other surface of the glass sheet can be uniformly subjected to the roughening treatment. Further, it is preferred to use a gas containing F (such as $SF_6$ or $CF_4$) as a source for the atmospheric plasma processing. With this, a plasma containing an HF-based gas is generated, and hence the efficiency of the roughening treatment is enhanced.

Note that when a non-reflective structure is formed on a surface of glass at the time of forming, the non-reflective structure can provide the same effect as that of the roughening treatment even if the roughening treatment is not carried out.

The high refractive index glass according to the first embodiment has a density of preferably 5.0 g/cm³ or less, 4.8 g/cm³ or less, 4.5 g/cm³ or less, 4.3 g/cm³ or less, 3.7 g/cm³ or less, particularly preferably 3.5 g/cm³ or less. With this, the weight of a device can be reduced. Note that the "density" can be measured by a well-known Archimedes method.

The high refractive index glass according to the first embodiment has a thermal expansion coefficient at 30 to 380° C. of preferably $30 \times 10^{-7}$ to $100 \times 10^{-7}$/° C., $40 \times 10^{-7}$ to $90 \times 10^{7}$/° C., $60 \times 10^{-7}$ to $85 \times 10^{-7}$/° C., particularly preferably $65 \times 10^{-7}$ to $80 \times 10^{-7}$/° C. In recent years, in an OLED lighting device, an OLED device, and a dye-sensitized solar cell, a glass sheet has been required to have flexibility from the viewpoint of improving their design elements in some cases. For enhancing the flexibility, the thickness of the glass sheet needs to be made smaller. In this case, when the thermal expansion coefficient of the glass sheet does not match that of a transparent conductive film such as an ITO film or an FTO film, the glass sheet is liable to warp. Thus, when the thermal expansion coefficient at 30 to 380° C. is controlled within any of the above-mentioned ranges, such a situation as described above can be easily prevented. Note that the "thermal expansion coefficient at 30 to 380° C." can be measured with, for example, a dilatometer.

The high refractive index glass according to the first embodiment has a strain point of preferably 630° C. or more, 650° C. or more, 670° C. or more, 690° C. or more, particularly preferably 700° C. or more. With this, the glass sheet resists heat shrinkage even if high-temperature heat treatment is performed during the production step of a device.

The high refractive index glass according to the first embodiment has a temperature at $10^2$ dPa·s of preferably 1,400° C. or less, 1,380° C. or less, 1,360° C. or less, 1,330° C. or less, particularly preferably 1,300° C. or less. With this, the meltability improves, and hence the production efficiency of glass improves. Herein, the term "temperature at $10^2$ dPa·s" refers to a value obtained by measurement using a platinum sphere pull up method.

A method of producing the high refractive index glass according to the first embodiment is exemplified as follows. First, a glass batch is manufactured by blending glass materials so that a desired glass composition is achieved. Next, the glass batch is melted, fined, and then formed into a desired shape. Subsequently, the resultant is processed into a desired shape.

Second Embodiment

One embodiment of the fourth invention (hereinafter, referred to as second embodiment) is described. Note that the second embodiment also serves as embodiments of the fifth invention and the sixth invention.

A high refractive index glass according to the second embodiment comprises, as a glass composition in terms of mass %, 10 to 60% of $SiO_2$, 0 to 5% of $B_2O_3$, 0.1 to 60% of BaO, 0.1 to 40% of $La_2O_3+Nb_2O_5$, and 0 to 10% of $Li_2O+Na_2O+K_2O$, and has a value for a mass ratio (MgO+CaO)/(SrO+BaO) of 0 to 0.5. The reasons why the content ranges of the components are limited as described above are described below. Note that in the following descriptions of the content ranges, the expression "%" refers to "mass %" unless otherwise stated.

The content of $SiO_2$ is 10 to 60%. When the content of $SiO_2$ decreases, it is difficult to form a glass network structure, resulting in difficulty in vitrification. Further, the viscosity of glass excessively lowers and hence it is difficult to ensure a high liquidus viscosity. Thus, the content of $SiO_2$ is 10% or more, preferably 12% or more, 15% or more, 20% or more, 25% or more, 28% or more, 35% or more, particularly preferably 40% or more. On the other hand, when the content of $SiO_2$ increases, the meltability and formability are liable to lower, and the refractive index nd is liable to lower. Thus, the content of $SiO_2$ is 60% or less, preferably 55% or less, 53% or less, 50% or less, 49% or less, 48% or less, particularly preferably 45% or less.

The content of $B_2O_3$ is 0 to 10%. When the content of $B_2O_3$ increases, the refractive index nd and Young's modulus are liable to lower, and the strain point is liable to lower. Thus, the content of $B_2O_3$ is 10% or less, preferably 8% or less, 5% or less, 4% or less, 3% or less, less than 2%, particularly preferably less than 1%, and glass is desirably substantially free of $B_2O_3$. Herein, the phrase "substantially free of $B_2O_3$" refers to the case where the content of $B_2O_3$ in a glass composition is less than 1,000 ppm (by mass).

Among alkaline-earth metal oxides, BaO is a component that increases the refractive index nd of glass without reducing the viscosity extremely, and the content of BaO is preferably 0.1 to 60%. When the content of BaO increases, the refractive index nd, density, and thermal expansion coefficient tend to increase. However, when the content of BaO is more than 60%, the glass composition loses its balance, with the result that the devitrification resistance is liable to lower. Thus, the content of BaO is 60% or less, preferably 53% or less, 48% or less, 44% or less, 40% or less, 39% or less, 36% or less, particularly suitably 33% or less. Note that when the content of BaO decreases, it is difficult to obtain a desired refractive index nd and it is difficult to ensure a high liquidus viscosity. Thus, the content of BaO is 0.1% or more, preferably 1% or more, 2% or more, 5% or more, 10% or more, 15% or more, 20% or more, 23% or more, particularly preferably 25% or more.

The content of $La_2O_3+Nb_2O_5$ is 0.1 to 40%. When the content of $La_2O_3+Nb_2O_5$ decreases, it is difficult to increase the refractive index nd. Thus, the content of $La_2O_3+Nb_2O_5$ is 0.1% or more, preferably 1% or more, 5% or more, 8% or more, 10% or more. On the other hand, when the content of $La_2O_3+Nb_2O_5$ increases, the density and thermal expansion coefficient excessively increase. When the content of $La_2O_3+Nb_2O_5$ is more than 40%, the glass composition loses its balance, with the result that the devitrification resistance is liable to lower and it is difficult to ensure a high liquidus viscosity. Thus, the content of $La_2O_3+Nb_2O_5$ is 40% or less, preferably 35% or less, 30% or less, 25% or less, 20% or less, 18% or less, particularly preferably 15% or less.

$La_2O_3$ is a component that increases the refractive index nd. When the content of $La_2O_3$ increases, the density and thermal expansion coefficient excessively increase and the devitrification resistance is liable to lower. Thus, the content range of $La_2O_3$ is suitably 0 to 25%, 0 to 22%, 0.1 to 18%, 0.5 to 14%, 1 to 12%, particularly suitably 2 to 10%.

$Nb_2O_5$ is a component that increases the refractive index nd. When the content of $Nb_2O_5$ increases, the density and thermal expansion coefficient excessively increase and the denitrification resistance is liable to lower. Thus, the content range of $Nb_2O_5$ is suitably 0 to 25%, 0 to 22%, 0.1 to 18%, 0.5 to 14%, 1 to 12%, particularly suitably 2 to 10%.

$Li_2O+Na_2O+K_2O$ is a component that reduces the viscosity of glass and is a component that adjusts the thermal expansion coefficient. However, when $Li_2O+Na_2O+K_2O$ is contained in a large amount, the viscosity of glass excessively lowers, with the result that it is difficult to ensure a high liquidus viscosity. Thus, the content of $Li_2O+Na_2O+K_2O$ is 10% or less, preferably 5% or less, 3% or less, 2% or less, 1% or less, 0.5% or less, particularly preferably 0.1% or less. Note that the content of each of $Li_2O$, $Na_2O$, and $K_2O$ is preferably 8% or less, 5% or less, 2% or less, 1% or less, 0.5% or less, particularly preferably 0.1% or less.

The value for the mass ratio (MgO+CaO)/(SrO+BaO) is 0 to 0.5. When the value for the mass ratio (MgO+CaO)/(SrO+BaO) decreases, it is difficult to ensure a high liquidus temperature and the strain point is liable to lower. On the other hand, when the value for the mass ratio (MgO+CaO)/(SrO+BaO) increases, the density increases. When the value is more than 0.5, the glass composition loses its balance, with the result that the devitrification resistance is liable to lower to the worse. Thus, the value for the mass ratio (MgO+CaO)/(SrO+BaO) is 0.5 or less, preferably 0.45 or less, 0.4 or less, 0.35 or less, 0.3 or less, 0.25 or less, 0.05 to 0.22, particularly preferably 0.1 to 0.2.

MgO is a component that increases the refractive index nd, Young's modulus, and strain point and is a component that reduces the viscosity. However, when MgO is contained in a large amount, the liquidus temperature rises, with the result that the devitrification resistance lowers, and the density and thermal expansion coefficient excessively increases. Thus, the content of MgO is preferably 20% or less, 10% or less, 5% or less, 3% or less, particularly preferably 1% or less.

The content of CaO is preferably 0 to 15%. When the content of CaO increases, the density and thermal expansion coefficient tend to increase. When the content of CaO is more than 15%, the glass composition loses its balance, with the result that the devitrification resistance is liable to lower. Thus, the content of CaO is preferably 15% or less, 13% or less, 11% or less, 9.5% or less, particularly preferably 8% or less. Note that when the content of CaO decreases, the meltability lowers, the Young's modulus lowers, and the refractive index nd is liable to lower. Thus, the content of CaO is preferably 0.5% or more, 1% or more, 2% or more, 3% or more, particularly preferably 5% or more.

The content of SrO is preferably 0 to 25%. When the content of SrO increases, the refractive index nd, density, and thermal expansion coefficient tends to increase, and when the content of SrO is more than 25%, the glass composition loses its balance, with the result that the devitrification resistance is liable to lower. Thus, the content of SrO is preferably 18% or less, 14% or less, 12% or less, 11% or less, 8% or less, 7% or less, particularly preferably 6% or less. Note that when the content of SrO decreases, the meltability is liable to lower and the refractive index nd is liable to lower. Thus, the content of SrO is preferably 0.1% or more, 0.8% or more, 1.4% or more, 3% or more, particularly preferably 4% or more.

In addition to the above-mentioned components, the following components may be added as optional components.

$TiO_2$ is a component that increases the refractive index nd. When the content of $TiO_2$ increases, the devitrification resistance is liable to lower. Thus, the content range of $TiO_2$ is suitably 0 to 25%, 0 to 22%, 0.1 to 18%, 1 to 14%, 2 to 12%, particularly suitably 4 to 10%.

$ZrO_2$ is a component that increases the refractive index nd. When the content of $ZrO_2$ increases, the devitrification resistance is liable to lower. Thus, the content range of $ZrO_2$ is suitably 0 to 25%, 0 to 20%, 0.1 to 10%, 0.1 to 8%, 0.1 to 6%, particularly suitably 0.1 to 5%.

The content of $Al_2O_3$ is preferably 0 to 20%. When the content of $Al_2O_3$ increases, devitrified crystals are liable to deposit in glass, the liquidus viscosity is liable to lower, and the refractive index nd is liable to lower. Thus, the content of $Al_2O_3$ is preferably 15% or less, 10% or less, 8% or less, particularly preferably 6% or less. Note that when the content of $Al_2O_3$ decreases, the glass composition loses its component balance, with the result that the glass is liable to denitrify to the worse. Thus, the content of $Al_2O_3$ is preferably 0.1% or more, 0.5% or more, particularly preferably 1% or more.

As a fining agent, one kind or two or more kinds selected from the group consisting of $As_2O_3$, $Sb_2O_3$, $CeO_2$, $SnO_2$, F, Cl, and $SO_3$ may be added in an amount of 0 to 3%. Note that it is preferred to use $As_2O_3$, $Sb_2O_3$, and F, in particular, $As_2O_3$ and $Sb_2O_3$ in an amount as small as possible from the environmental viewpoint, and each of the contents thereof is preferably less than 0.1%. In consideration of the above-mentioned points, $SnO_2$, $SO_3$, and Cl are each preferably used as the fining agent. In particular, the content of $SnO_2$ is preferably 0 to 1%, 0.01 to 0.5%, particularly preferably 0.05 to 0.4%. Further, the content of $SnO_2+SO_3+Cl$ is preferably 0 to 1%, 0.001 to 1%, 0.01 to 0.5%, particularly preferably 0.01 to 0.3%. Herein, the term "$SnO_2+SO_3+Cl$" refers to the total amount of $SnO_2$, $SO_3$, and Cl.

PbO is a component that reduces the viscosity, but is preferably used in an amount as small as possible from the environmental viewpoint. The content of PbO is preferably 0.5% or less, and it is desirable that glass be substantially free of PbO. Herein, the phrase "substantially free of PbO" refers to the case where the content of PbO in a glass composition is less than 1,000 ppm (by mass).

In the high refractive index glass according to the second embodiment, it is possible to construct suitable glass composition ranges by combining the suitable ranges of the respective components. Of those, specific examples of the suitable glass composition ranges are as follows:

(1) comprising, as a glass composition in terms of mass %, 20 to 60% of $SiO_2$, 0 to 5% of $B_2O_3$, 10 to 40% of BaO, 0.1 to 25% of $La_2O_3$, 0.1 to 25% of $Nb_2O_5$, 0.1 to 25% of $La_2O_3+Nb_2O_5$, and 0 to 1% of $Li_2O+Na_2O+K_2O$, having a value for a mass ratio (MgO+CaO)/(SrO+BaO) of 0 to 0.3, and having a refractive index nd of 1.55 to 2.0;

(2) comprising, as a glass composition in terms of mass %, 25 to 55% of $SiO_2$, 0 to 5% of $B_2O_3$, 10 to 40% of BaO, 0.1 to 18% of $La_2O_3$, 0.1 to 18% of $Nb_2O_5$, 0.1 to 20% of $La_2O_3+Nb_2O_5$, and 0 to 0.5% of $Li_2O+Na_2O+K_2O$, having a value for a mass ratio (MgO+CaO)/(SrO+BaO) of 0 to 0.3, and having a refractive index nd of 1.55 to 2.0;

(3) comprising, as a glass composition in terms of mass %, 25 to 50% of $SiO_2$, 0 to 5% of $B_2O_3$, 20 to 40% of BaO, 0.1 to 10% of $La_2O_3$, 0.1 to 10% of $Nb_2O_5$, 0.1 to 20% of $La_2O_3+Nb_2O_5$, and 0 to 0.1% of $Li_2O+Na_2O+K_2O$, having a value for a mass ratio (MgO+CaO)/(SrO+BaO) of 0 to 0.2, and having a refractive index nd of 1.55 to 2.0; and (4) comprising, as a glass composition in terms of mass %, 25 to 45% of $SiO_2$, 0 to 3% of $B_2O_3$, 20 to 40% of BaO, 0.1 to 10% of $La_2O_3$, 0.1 to 10% of $Nb_2O_5$, 0.1 to 15% of $La_2O_3+Nb_2O_5$, and 0 to 0.1% of $Li_2O+Na_2O+K_2O$, having a value for a mass ratio (MgO+CaO)/(SrO+BaO) of 0 to 0.2, and having a refractive index nd of 1.55 to 2.0.

The high refractive index glass according to the second embodiment has a refractive index nd of 1.55 or more, preferably 1.58 or more, 1.60 or more, 1.63 or more, 1.65 or more, 1.67 or more, 1.69 or more, 1.70 or more, particularly preferably 1.71 or more. When the refractive index nd is less than 1.55, light cannot be extracted efficiently because of the reflectance at the interface between an ITO film and the glass. On the other hand, when the refractive index nd is more than 2.3, the reflectance at the interface between air and the glass becomes higher, and hence it is difficult to enhance light extraction efficiency even if the surface of the glass is subjected to roughening treatment. Thus, the refractive index nd is 2.3 or less, preferably 2.2 or less, 2.1 or less, 2.0 or less, 1.9 or less, particularly preferably 1.75 or less.

The high refractive index glass according to the second embodiment has a strain point of preferably 630° C. or more, 650° C. or more, 670° C. or more, 690° C. or more, particularly preferably 700° C. or more. When an FTO film is formed in a device such as a dye-sensitized solar cell, a high temperature of 600° C. or more is necessary for forming a highly transparent film with low electrical resistance. However, a conventional high refractive index glass did not have sufficient heat resistance, and hence it was difficult to strike a balance between both transparency and low electrical resistance. Thus, when the strain point is controlled within any of the above-mentioned ranges, it is possible to strike a balance between transparency and low electrical resistance in a dye-sensitized solar cell or the like, and even if heat treatment is carried out in the production process of such device, the glass in the device is difficult to shrink with the heat.

The high refractive index glass according to the second embodiment has a liquidus temperature of preferably 1,200° C. or less, 1,150° C. or less, 1,130° C. or less, 1,110° C. or less, 1,090° C. or less, 1,070° C. or less, 1,050° C. or less, particularly preferably 1,010° C. or less. Further, the liquidus viscosity is preferably $10^{3.5}$ dPa·s or more, $10^{3.8}$ dPa·s or more, $10^{4.2}$ dPa·s or more, $10^{4.4}$ dPa·s or more, $10^{4.6}$ dPa·s or more, $10^{5.0}$ dPa·s or more, particularly preferably $10^{5.2}$ dPa·s or more. With this, the glass hardly devitrifies at the time of forming, and it becomes easier to form the glass into a glass sheet by an overflow down-draw method.

The high refractive index glass according to the second embodiment has a density of preferably 5.0 g/cm³ or less, 4.8 g/cm³ or less, 4.5 g/cm³ or less, 4.3 g/cm³ or less, 3.7 g/cm³ or less, 3.5 g/cm³ or less, 3.4 g/cm³ or less, 3.3 g/cm³ or less, particularly preferably 3.2 g/cm³ or less. With this, the weight of a device can be reduced.

The high refractive index glass according to the second embodiment preferably has a sheet shape, and has a thickness of preferably 1.5 mm or less, 1.3 mm or less, 1.1 mm or less, 0.8 mm or less, 0.6 mm or less, 0.5 mm or less, 0.3 mm or less, 0.2 mm or less, particularly preferably 0.1 mm or less. As the thickness becomes smaller, the flexibility increases, and a lighting device with excellent design can be easily produced. However, when the thickness becomes extremely small, the glass is liable to be damaged. Thus, the thickness is preferably 10 μm or more, particularly preferably 30 μm or more.

When the high refractive index glass according to the second embodiment has a sheet shape, the glass sheet preferably has at least one unpolished surface. The theoretical strength of glass is intrinsically very high. However, glass often breaks even by a stress far lower than the theoretical strength. This is because small defects called Griffith flaw are produced in the surfaces of the glass in some steps after the glass is formed into a glass sheet, such as a polishing step. Thus, when a surface of glass is not polished, the mechanical strength that the glass intrinsically has is not easily impaired, and hence the glass does not easily break. Further, when a surface of glass is not polished, the polishing step can be eliminated, and hence the production cost of the glass sheet can be reduced.

The high refractive index glass according to the second embodiment has at least one surface (provided that the surface is an effective surface) having a surface roughness Ra of preferably 10 Å or less, 5 Å or less, 3 Å or less, particularly preferably 2 Å or less. When the surface roughness Ra is more than 10 Å, the quality of an ITO film formed on the surface deteriorates and uniform light emission is not easily achieved.

The high refractive index glass according to the second embodiment is preferably formed by an overflow down-draw method. With this, an unpolished glass sheet having good surface quality can be produced. This is because when a glass sheet is formed by the overflow down-draw method, the surfaces that should serve as the surfaces of the glass sheet are formed in the state of a free surface without being brought into contact with a trough-shaped refractory. The structure and material of the trough-shaped structure are not particularly limited as long as the desired size and surface precision of the glass sheet can be achieved. Further, a method of applying a force to molten glass for down-drawing the molten glass downward is also not particularly limited. For example, it is possible to adopt a method comprising rotating a heat-resistant roll having a sufficiently large width in the state of being in contact with molten glass, to thereby draw the molten glass, or a method comprising bringing a plurality of pairs of heat-resistant rolls into contact with only the vicinity of the edge surfaces of molten glass, to thereby draw the molten glass.

A method other than the overflow down-draw method, such as a down-draw method (such as a slot down method or a re-draw method), a float method, or a roll-out method may also be adopted.

The high refractive index glass according to the second embodiment is preferably subjected to roughening treatment on one of its surfaces by HF etching, sandblasting, or the like. The surface roughness Ra of the roughening treated surface is preferably 10 Å or more, 20 Å or more, 30 Å or more, particularly preferably 50 Å or more. When the roughening treated surface is arranged on the side to be brought into contact with air of an OLED lighting device or the like, the roughening treated surface has a non-reflective structure, and hence light produced in an organic light-emitting layer does not easily return into the organic light-emitting layer. As a result, light extraction efficiency can be enhanced. Further, irregularities may be provided in a surface of glass by thermal processing such as re-pressing. With this, a precise reflective structure can be formed in the surface of the glass. The interval and depth of the irregularities are recommended to be adjusted in consideration of the refractive index nd of the glass. Further, a resin film with irregularities may be attached on a surface of glass.

When the roughening treatment is performed by atmospheric plasma processing, while the surface condition of one surface of a glass sheet is maintained, the other surface of the glass sheet can be uniformly subjected to the roughening treatment. Further, it is preferred to use a gas containing F (such as $SF_6$ or $CF_4$) as a source for the atmospheric plasma processing. With this, a plasma containing an HF-based gas is generated, and hence the efficiency of the roughening treatment is enhanced.

Note that when a non-reflective structure is formed on a surface of glass at the time of forming, the non-reflective structure can provide the same effect as that of the roughening treatment even if the roughening treatment is not carried out.

The high refractive index glass according to the second embodiment has a thermal expansion coefficient at 30 to 380° C. of preferably $45\times10^{-7}$ to $110\times10^{-7}/°$ C., $50\times10^{-7}$ to $100\times10^{-7}/°$ C., $60\times10^{-7}$ to $95\times10^{-7}/°$ C., $65\times10^{-7}$ to $90\times10^{-7}/°$ C., $65\times10^{-7}$ to $85\times10^{7}/°$ C., particularly preferably $70\times10^{-7}$ to $80\times10^{-7}/°$ C. In recent years, a glass sheet has been required to have flexibility in an OLED lighting device, an OLED device, and a dye-sensitized solar cell from the viewpoint of improving their design elements in some cases. For enhancing the flexibility, the thickness of the glass sheet needs to be made smaller. In this case, when the thermal expansion coefficient of the glass sheet does not match that of a transparent conductive film such as an ITO film or an FTO film, the glass sheet is liable to warp. Thus, when the thermal expansion coefficient at 30 to 380° C. is controlled within any of the above-mentioned ranges, such a situation as described above can be easily prevented.

The high refractive index glass according to the second embodiment has a temperature at $10^{2.5}$ dPa·s of preferably 1,450° C. or less, 1,400° C. or less, 1,370° C. or less, 1,330° C. or less, 1,290° C. or less, particularly preferably 1,270° C. or less. With this, the meltability improves, and hence the production efficiency of glass improves.

A method of producing the high refractive index glass according to the second embodiment is exemplified as follows. First, a glass batch is manufactured by blending glass materials so that a desired glass composition is achieved. Next, the glass batch is melted, fined, and then formed into a desired shape. Subsequently, the resultant is processed into a desired shape.

Third Embodiment

One embodiment of the seventh invention (hereinafter, referred to as third embodiment) is described. Note that the third embodiment also serves as embodiments of the eighth invention and the ninth invention.

The high refractive index glass according to the third embodiment comprises, as a glass composition in terms of mol %, 20 to 70% of $SiO_2+Al_2O_3+B_2O_3$, 20 to 70% of $SiO_2$, 0 to 30% of $B_2O_3$, 0 to 50% of $MgO+CaO+SrO+BaO$, and 0 to 30% of $BaO+La_2O_3+Nb_2O_5+ZrO_2+TiO_2$, and has a molar ratio $B_2O_3/SiO_2$ of 0 to 1, a molar ratio $SiO_2/(MgO+CaO+SrO+BaO+La_2O_3+Nb_2O_5)$ of 0.1 to 6, and a molar ratio $(MgO+CaO+SrO+BaO)/(MgO+CaO+SrO+BaO+La_2O_3+Nb_2O_5+Gd_2O_3)$ of 0.1 to 0.99. The reasons why the content range of each component has been restricted as mentioned above are described below. Note that in the following description of the content range, the expression "%" refers to "mol %" unless otherwise specified.

The content of $SiO_2+Al_2O_3+B_2O_3$ is 20 to 70%. When the content of $SiO_2+Al_2O_3+B_2O_3$ decreases, vitrification is difficult, it is difficult to ensure a high liquidus viscosity, and the density tends to increase. Thus, the content of $SiO_2+Al_2O_3+B_2O_3$ is 20% or more, preferably 30% or more, 40% or more, 50% or more, 55% or more, particularly preferably 60% or more. On the other hand, when the content of $SiO_2+Al_2O_3+B_2O_3$ increases, it is difficult to increase the refractive index nd. Thus, the content of $SiO_2+Al_2O_3+B_2O_3$ is preferably 70% or less, 68% or less, particularly preferably 66% or less.

The content of $SiO_2$ is 20 to 70%. When the content of $SiO_2$ decreases, it is difficult to form a glass network structure, resulting in difficulty in vitrification. Further, the viscosity of glass excessively lowers and hence it is difficult to ensure ahighliquidus viscosity. In addition, thedensitytends to increase. Thus, the content of $SiO_2$ is 20% or more, preferably 30% or more, 40% or more, 50% or more, particularly preferably 60% or more. On the other hand, when the content of $SiO_2$ increases, the meltability and formability are liable to lower and the refractive index nd is liable to lower. Thus, the content of $SiO_2$ is 70% or less, preferably 68% or less, 65% or less, particularly preferably 63% or less.

The content of $Al_2O_3$ is preferably 0 to 10%. When the content of $Al_2O_3$ increases, devitrified crystals are liable to deposit in glass, the liquidus viscosity is liable to lower. Thus, the content of $Al_2O_3$ is preferably 10% or less, 8% or less, 6% or less, particularly preferably 5% or less. Note that when the content of $Al_2O_3$ decreases, the glass composition loses its balance, with the result that the glass is liable to denitrify to the worse. Thus, the content of $Al_2O_3$ is preferably 0.1% or more, 0.5% or more, particularly preferably 1% or more.

The content of $B_2O_3$ is 0 to 30%. When the content of $B_2O_3$ increases, the refractive index nd and Young's modulus are liable to lower, and phase separation occurs, with the result that the devitrification resistance may lower abruptly. Thus, the content of $B_2O_3$ is 30% or less, preferably 15% or less, 10% or less, 8% or less, 5% or less, 4% or less, less than 2%, 1% or less, less than 1%, 0.5% or less, particularly preferably 0.1% or less.

The content of MgO+CaO+SrO+BaO is 0 to 50%. When the content of MgO+CaO+SrO+BaO increases, the thermal expansion coefficient and density excessively increase, and the glass composition loses its component balance, with the result that the devitrification resistance is liable to lower, and it is difficult to ensure a high liquidus viscosity. Thus, the content of MgO+CaO+SrO+BaO is 50% or less, preferably 45% or less, 40% or less, 35% or less, 33% or less, particularly preferably 30% or less. Note that when the content of MgO+CaO+SrO+BaO decreases, it is difficult to increase the refractive index nd. Thus, the content of MgO+CaO+SrO+BaO is preferably 1% or more, 5% or more, 10% or more, 15% or more, 20% or more, 22% or more, particularly preferably 25% or more.

MgO is a component that increases the refractive index nd, Young's modulus, and strain point and is a component that reduces the viscosity. However, when MgO is contained in a large amount, the liquidus temperature rises, with the result that the devitrification resistance lowers, and the density and thermal expansion coefficient excessively increase. Thus, the content of MgO is preferably 10% or less, 5% or less, 3% or less, 2% or less, 1.5% or less, 1% or less, particularly preferably 0.5% or less.

The content of CaO is preferably 0 to 30%. When the content of CaO increases, the density and thermal expansion coefficient tend to increase. When the content of CaO is more than 30%, the glass composition loses its balance, with the result that the devitrification resistance is liable to lower. Thus, the content of CaO is preferably 30% or less, 20% or less, 15% or less, 13% or less, 11% or less, particularly preferably 10% or less. Note that when the content of CaO decreases, the meltability lowers, the Young's modulus lowers, and the refractive index nd is liable to lower. Thus, the content of CaO is preferably 2% or more, 4% or more, 6% or more, particularly preferably 8% or more.

The content of SrO is preferably 0 to 20%. When the content of SrO increases, the refractive index nd, density, and thermal expansion coefficient tend to increase. When the content of SrO is more than 20%, the glass composition loses its balance, with the result that the devitrification resistance is liable to lower. Thus, the content of SrO is preferably 20% or less, 15% or less, 12% or less, 8% or less, particularly preferably 6% or less. Note that when the content of SrO decreases, the meltability is liable to lower and the refractive index nd is liable to lower. Thus, the content of SrO is preferably 0.5% or more, 1% or more, 2% or more, 3% or more, particularly preferably 3.5% or more.

Among alkaline-earth metal oxides, BaO is a component that increases the refractive index nd of glass without reducing the viscosity extremely. The content of BaO is preferably 0 to 40%. When the content of BaO increases, the refractive index nd, density, and thermal expansion coefficient tend to increase. However, when the content of BaO is more than 40%, the glass composition loses its balance, with the result that the denitrification resistance is liable to lower. Thus, the content of BaO is preferably 40% or less, 30% or less, 25% or less, particularly preferably 20% or less. Note that when the content of BaO decreases, it is difficult to obtain a desired refractive index nd and it is difficult to ensure a high liquidus viscosity. Thus, the content of BaO is preferably 0.5% or more, 1% or more, 2% or more, 5% or more, particularly preferably 10% or more.

When the content of $BaO+La_2O_3+Nb_2O_5+ZrO_2+TiO_2$ is appropriately restricted, it is possible to increase the refractive index nd while maintaining a high liquidus viscosity. The content of $BaO+La_2O_3+Nb_2O_5+ZrO_2+TiO_2$ is 0 to 30%. When the content of $BaO+La_2O_3+Nb_2O_5+ZrO_2+TiO_2$ is more than 30%, the glass composition loses its component balance, with the result that glass is liable to denitrify, and hence the liquidus viscosity is liable to lower. Further, the density and thermal expansion coefficient excessively increase. Thus, the content of $BaO+La_2O_3+Nb_2O_5+ZrO_2+TiO_2$ is 30% or less, preferably 28% or less, 25% or less, 22% or less. Note that when the content of $BaO+La_2O_3+Nb_2O_5+ZrO_2+TiO_2$ decreases, the refractive index nd is liable to lower. Thus, the content of $BaO+La_2O_3+Nb_2O_5+ZrO_2+TiO_2$ is preferably 5% or more, 10% or more, 15% or more, 18% or more, particularly preferably 20% or more.

$La_2O_3$ is a component that increases the refractive index nd. When the content of $La_2O_3$ increases, the density and thermal expansion coefficient excessively increase and the devitrification resistance is liable to lower. Thus, the content range of $La_2O_3$ is suitably 0 to 25%, 0 to 15%, 0.1 to 10%, 0.1 to 7%, 0.1 to 5%, particularly suitably 0.5 to 3%.

$Nb_2O_5$ is a component that increases the refractive index nd. When the content of $Nb_2O_5$ increases, the density and thermal expansion coefficient excessively increase and the devitrification resistance is liable to lower. Thus, the content range of $Nb_2O_5$ is suitably 0 to 20%, 0 to 12%, 0 to 8%, 0 to 4%, particularly suitably 0.1 to 3%.

$TiO_2$ is a component that increases the refractive index nd. When the content of $TiO_2$ increases, the devitrification resistance is liable to lower. Thus, the content range of $TiO_2$ is suitably 0 to 20%, 0.1 to 18%, 0.5 to 15%, 1 to 12%, 2 to 10%, particularly suitably 3 to 8%.

$ZrO_2$ is a component that increases the refractive index nd. When the content of $ZrO_2$ increases, the devitrification resistance is liable to lower. Thus, the content range of $ZrO_2$ is suitably 0 to 20%, 0 to 15%, 0.1 to 12%, 0.1 to 10%, 0.1 to 8%, particularly suitably 0.5 to 5%.

The molar ratio $B_2O_3/SiO_2$ is 0 to 1. When the molar ratio $B_2O_3/SiO_2$ increases, the glass is liable to undergo phase separation, and the devitrification resistance is liable to lower. Thus, the molar ratio $B_2O_3/SiO_2$ is 0 to 1, preferably 0 to 0.8, 0 to 0.6, 0 to 0.5, 0 to 0.4, 0 to 0.2, 0 to 0.1, particularly preferably 0 to 0.05.

When the molar ratio $SiO_2/(MgO+CaO+SrO+BaO+La_2O_3+Nb_2O_5)$ is appropriately restricted, it is easy to increase the refractive index while maintaining devitrification resistance and a high liquidus viscosity. When the molar ratio $SiO_2/(MgO+CaO+SrO+BaO+La_2O_3+Nb_2O_5)$ increases, the density tends to lower and the liquidus viscosity tends to increase. However, the refractive index nd is liable to lower. Thus, the molar ratio $SiO_2/(MgO+CaO+SrO+BaO+La_2O_3+Nb_2O_5)$ is 6 or less, preferably 5 or less, 4 or less, 3.5 or less, 3 or less, 2.5 or less, particularly preferably 2.3 or less. On the other hand, when the molar ratio $SiO_2/(MgO+CaO+SrO+BaO+La_2O_3+Nb_2O_5)$ decreases, it is difficult to ensure a desired refractive index nd, and the thermal expansion coefficient excessively increases in some cases. Thus, the molar ratio $SiO_2/(MgO+CaO+SrO+BaO+La_2O_3+Nb_2O_5)$ is 0.1 or more, preferably 0.5 or more, 1 or more, 1.2 or more, 1.3 or more, 1.5 or more, particularly preferably 1.8 or more.

When the molar ratio $(MgO+CaO+SrO+BaO)/(MgO+CaO+SrO+BaO+La_2O_3+Nb_2O_5+Gd_2O_3)$ is appropriately restricted, it is easy to increase the refractive index while maintaining the devitrification resistance and a high liquidus viscosity. When the molar ratio $(MgO+CaO+SrO+BaO)/(MgO+CaO+SrO+BaO+La_2O_3+Nb_2O_5+Gd_2O_3)$ is more than 0.99, it is difficult to increase the refractive index and it is difficult to ensure a high liquidus viscosity. Thus, the molar ratio $(MgO+CaO+SrO+BaO)/(MgO+CaO+SrO+BaO+La_2O_3+Nb_2O_5+Gd_2O_3)$ is 0.99 or less, preferably 0.98 or less, 0.97 or less, particularly preferably 0.96 or less. On the other hand, when the molar ratio $(MgO+CaO+SrO+BaO)/(MgO+CaO+SrO+BaO+La_2O_3+Nb_2O_5+Gd_2O_3)$ is less than 0.1, the glass composition loses its component balance, with the result that the devitrification resistance is liable to lower to the worse. Thus, the molar ratio $(MgO+CaO+SrO+BaO)/(MgO+CaO+SrO+BaO+La_2O_3+Nb_2O_5+Gd_2O_3)$ is 0.1 or more, preferably 0.3 or more, 0.5 or more, 0.6 or more, 0.7 or more, 0.8 or more, 0.84 or more, 0.9 or more, 0.92 or more, particularly preferably 0.95 or more.

$Gd_2O_3$ is a component that increases the refractive index nd. When content of $Gd_2O_3$ increases, the devitrification resistance is liable to lower. Thus, the content range of $Gd_2O_3$ is suitably 0 to 10%, 0 to 8%, 0.1 to 5%, 0.1 to 4%, 0.2 to 3%, particularly suitably 0.3 to 2%.

In addition to the above-mentioned components, the following components may be added as optional components.

$Li_2O+Na_2O+K_2O$ is a component that reduces the viscosity of glass and is a component that adjusts the thermal expansion coefficient. However, when $Li_2O+Na_2O+K_2O$ is contained in a large amount, the viscosity of glass excessively lowers, with the result that it is difficult to ensure a high liquidus viscosity. Thus, the content of $Li_2O+Na_2O+K_2O$ is preferably 15% or less, 10% or less, 5% or less, 2% or less, 1% or less, 0.5% or less, particularly preferably 0.1% or less. Note that the content of each of $Li_2O$, $Na_2O$, and $K_2O$ is preferably 10% or less, 8% or less, 5% or less, 2% or less, 1% or less, 0.5% or less, particularly preferably 0.1% or less. Herein, the term "$Li_2O+Na_2O+K_2O$" refers to the total amount of $Li_2O$, $Na_2O$, and $K_2O$.

As a fining agent, one kind or two or more kinds selected from the group consisting of $As_2O_3$, $Sb_2O_3$, $CeO_2$, $SnO_2$, F, Cl, and $SO_3$ may be added in an amount of 0 to 3%. Note that it is preferred to use $As_2O_3$, $Sb_2O_3$, and F, in particular, $As_2O_3$ and $Sb_2O_3$ in an amount as small as possible from the environmental viewpoint, and each of the contents thereof is preferably less than 0.1%. In consideration of the above-mentioned points, $SnO_2$, $SO_3$, and Cl are each preferably used as the fining agent. In particular, the content of $SnO_2$ is preferably 0 to 1%, 0.01 to 0.5%, particularly preferably 0.05 to 0.4%. Further, the content of $SnO_2+SO_3+Cl$ is preferably 0 to 1%, 0.001 to 1%, 0.01 to 0.5%, particularly preferably 0.01 to 0.3%. Herein, the term "$SnO_2+SO_3+Cl$" refers to the total amount of $SnO_2$, $SO_3$, and Cl.

PbO is a component that reduces the viscosity, but is preferably used in an amount as small as possible from the environmental viewpoint. The content of PbO is preferably 0.5% or less, and it is desirable that glass be substantially free of PbO. Herein, the phrase "substantially free of PbO" refers to the case where the content of PbO in a glass composition is less than 1,000 ppm (by mass).

In the high refractive index glass according to the third embodiment, it is possible to construct suitable glass composition ranges by combining the suitable ranges of the respective components. Of those, specific examples of the suitable glass composition ranges are as follows:

(1) comprising, as a glass composition in terms of mol %, 50 to 70% of $SiO_2+Al_2O_3+B_2O_3$, 50 to 70% of $SiO_2$, 0 to 10% of $B_2O_3$, 20 to 35% of $MgO+CaO+SrO+BaO$, and 15 to 25% of $BaO+La_2O_3+Nb_2O_5+ZrO_2+TiO_2$, having a molar ratio $B_2O_3/SiO_2$ of 0 to 1, a molar ratio $SiO_2/(MgO+CaO+SrO+BaO+La_2O_3+Nb_2O_5)$ of 1 to 2.5, and a molar ratio $(MgO+CaO+SrO+BaO)/(MgO+CaO+SrO+BaO+La_2O_3+Nb_2O_5+Gd_2O_3)$ of 0.6 to 0.99, and having a refractive index of 1.55 to 2.3;

(2) comprising, as a glass composition in terms of mol %, 55 to 70% of $SiO_2+Al_2O_3+B_2O_3$, 55 to 70% of $SiO_2$, 0 to 5% of $B_2O_3$, 22 to 33% of $MgO+CaO+SrO+BaO$, and 15 to 25% of $BaO+La_2O_3+Nb_2O_5+ZrO_2+TiO_2$, having a molar ratio $B_2O_3/SiO_2$ of 0 to 0.5, a molar ratio $SiO_2/(MgO+CaO+SrO+BaO+La_2O_3+Nb_2O_5)$ of 1.2 to 2.5, and a molar ratio $(MgO+CaO+SrO+BaO)/(MgO+CaO+SrO+BaO+La_2O_3+Nb_2O_5+Gd_2O_3)$ of 0.7 to 0.99, and having a refractive index of 1.55 to 2.3;

(3) comprising, as a glass composition in terms of mol %, 60 to 70% of $SiO_2+Al_2O_3+B_2O_3$, 60 to 70% of $SiO_2$, 0 to 0.5% of $B_2O_3$, 25 to 30% of $MgO+CaO+SrO+BaO$, and 20 to 25% of $BaO+La_2O_3+Nb_2O_5+ZrO_2+TiO_2$, having a molar ratio $B_2O_3/SiO_2$ of 0 to 0.1, a molar ratio $SiO_2/(MgO+CaO+SrO+BaO+La_2O_3+Nb_2O_5)$ of 1.8 to 2.3, and a molar ratio $(MgO+CaO+SrO+BaO)/(MgO+CaO+SrO+BaO+La_2O_3+Nb_2O_5+Gd_2O_3)$ of 0.9 to 0.99, and a having refractive index of 1.55 to 2.3; and (4) comprising, as a glass composition in terms of mol %, 60 to 70% of $SiO_2+Al_2O_3+B_2O_3$, 60 to 70% of $SiO_2$, 0 to 0.1% of $B_2O_3$, 25 to 30% of $MgO+CaO+SrO+BaO$, and 20 to 25% of $BaO+La_2O_3+Nb_2O_5+ZrO_2+TiO_2$, having a molar ratio $B_2O_3/SiO_2$ of 0 to 0.1, a molar ratio $SiO_2/(La_2O_3+Nb_2O_5+RO)$ of 1.8 to 2.3, and a molar ratio $(MgO+CaO+SrO+BaO)/(MgO+CaO+SrO+BaO+La_2O_3+Nb_2O_5+Gd_2O_3)$ of 0.95 to 0.99, and having a refractive index of 1.55 to 2.3.

The high refractive index glass according to the third embodiment has a refractive index nd of 1.55 or more, preferably 1.58 or more, 1.6 or more, 1.63 or more, 1.65 or more, 1.67 or more, 1.69 or more, 1.7 or more, particularly preferably 1.71 or more. When the refractive index nd is less than 1.55, light cannot be extracted efficiently because of the reflectance at the interface between an ITO film and the glass. On the other hand, when the refractive index nd is more than 2.3, the reflectance at the interface between air and the glass becomes higher, and hence it is difficult to enhance light extraction efficiency even if the surface of the glass is subjected to roughening treatment. Thus, the refractive index nd is 2.3 or less, preferably 2.2 or less, 2.1 or less, 2.0 or less, 1.9 or less, particularly preferably 1.75 or less.

The high refractive index glass according to the third embodiment has a liquidus temperature of preferably 1,200° C. or less, 1,150° C. or less, 1,130° C. or less, 1,110° C. or less, 1,090° C. or less, particularly preferably 1,070° C. or less. Further, the liquidus viscosity is preferably $10^{3.0}$ dPa·s or more, $10^{3.5}$ dPa·s or more, $10^{4.0}$ dPa·s or more, $10^{4.5}$ dPa·s or more, $10^{4.8}$ dPa·s or more, $10^{5.1}$ dPa·s or more, $10^{5.3}$ dPa·s or more, particularly preferably $10^{5.5}$ dPa·s or more. With this, the glass hardly devitrifies at the time of forming, and the glass is easily formed into a glass sheet by an overflow down-draw method.

The high refractive index glass according to the third embodiment has a density of preferably 5.0 g/cm$^3$ or less, 4.8 g/cm$^3$ or less, 4.5 g/cm$^3$ or less, 4.3 g/cm$^3$ or less, 3.7 g/cm$^3$ or less, 3.6 g/cm$^3$ or less, 3.4 g/cm$^3$ or less, particularly preferably 3.3 g/cm$^3$ or less. With this, the weight of a device can be reduced. Note that the "density" can be measured by a well-known Archimedes method.

The high refractive index glass according to the third embodiment has a thermal expansion coefficient at 30 to 380° C. of preferably $50 \times 10^{-7}$ to $100 \times 10^{-7}$/° C., $60 \times 10^{-7}$ to $95 \times 10^{-7}$/° C., $65 \times 10^{-7}$ to $90 \times 10^{-7}$/° C., $65 \times 10^{-7}$ to $85 \times 10^{-7}$/° C., particularly preferably $70 \times 10^{-7}$ to $80 \times 10^{-7}$/° C. In recent years, a glass sheet has been required to have flexibility in an OLED lighting device, an OLED device, and a dye-sensitized solar cell from the viewpoint of improving their design elements in some cases. For enhancing the flexibility, the thickness of the glass sheet needs to be made smaller. In this case, when the thermal expansion coefficient of the glass sheet does not match that of a transparent conductive film such as an ITO film or an FTO film, the glass sheet is liable to warp. Thus, when the thermal expansion coefficient at 30 to 380° C. is controlled within any of the above-mentioned ranges, such a situation as described above can be easily prevented. Note that the "thermal expansion coefficient at 30 to 380° C." can be measured with, for example, a dilatometer.

The high refractive index glass according to the third embodiment has a strain point of preferably 630° C. or more, 650° C. or more, 670° C. or more, 690° C. or more, particularly preferably 700° C. or more. With this, the glass sheet resists heat shrinkage even if high-temperature heat treatment is performed during the production step of a device.

The high refractive index glass according to the third embodiment has a temperature at $10^{2.5}$ dPa·s of preferably 1,400° C. or less, 1,350° C. or less, 1,300° C. or less, particularly preferably 1,250° C. or less. With this, the meltability improves, and hence the production efficiency of glass improves.

The high refractive index glass according to the third embodiment preferably has a sheet shape (including a film shape), and has a thickness of preferably 1.5 mm or less, 1.3 mm or less, 1.1 mm or less, 0.8 mm or less, 0.6 mm or less, 0.5 mm or less, 0.3 mm or less, 0.2 mm or less, particularly preferably 0.1 mm or less. As the thickness becomes smaller, the flexibility increases, and a lighting device with excellent design can be easily produced. However, when the thickness becomes extremely small, the glass is liable to be damaged. Thus, the thickness is preferably 10 μm or more, particularly preferably 30 μm or more.

When the high refractive index glass according to the third embodiment has a sheet shape (including a film shape), the glass sheet preferably has an unpolished surface as at least one surface. The theoretical strength of glass is intrinsically very high. However, glass often breaks even by a stress far lower than the theoretical strength. This is because small defects called Griffith flaw are produced in the surfaces of the glass in some steps after the glass is formed into a glass sheet, such as a polishing step. Thus, when a surface of glass is not polished, the mechanical strength that the glass intrinsically has is not easily impaired, and hence the glass does not easily break. Further, when a surface of glass is not polished, the polishing step can be eliminated, and hence the production cost of the glass sheet can be reduced.

The high refractive index glass according to the third embodiment has at least one surface having a surface roughness Ra of preferably 10 Å or less, 5 Å or less, 3 Å or less, particularly preferably 2 Å or less. When the surface roughness Ra is more than 10 Å, the quality of an ITO film formed on the surface deteriorates and uniform light emission is not easily achieved, The high refractive index glass according to the third embodiment is preferably formed by an overflow down-draw method. With this, an unpolished glass sheet having good surface quality can be produced. This is because when a glass sheet is formed by the overflow down-draw method, the surfaces that should serve as the surfaces of the glass sheet are formed in the state of a free surface without being brought into contact with a trough-shaped refractory. The structure and material of the trough-shaped structure are not particularly limited as long as the desired size and surface precision of the glass sheet can be achieved. Further, a method of applying a force to molten glass for down-drawing the molten glass downward is also not particularly limited. For example, it is possible to adopt a method comprising rotating a heat-resistant roll having a sufficiently large width in the state of being in contact with molten glass, to thereby draw the molten glass, or a method comprising bringing a plurality of pairs of heat-resistant rolls into contact with only the vicinity of the edge surfaces of molten glass, to thereby draw the molten glass.

A method other than the overflow down-draw method, such as a down-draw method (such as a slot down method or a re-draw method), a float method, or a roll-out method may also be adopted.

The high refractive index glass according to the third embodiment is preferably subjected to roughening treatment on one of its surfaces by HF etching, sandblasting, or the like. The surface roughness Ra of the roughening treated surface is preferably 10 Å or more, 20 Å or more, 30 Å or more, particularly preferably 50 Å or more. When the roughening treated surface is arranged on the side to be brought into contact with air of an OLED lighting device or the like, the roughening treated surface has a non-reflective structure, and hence light produced in an organic light-emitting layer does not easily return into the organic light-emitting layer. As a result, light extraction efficiency can be enhanced. Further, irregularities may be provided in a surface of glass by thermal processing such as re-pressing. With this, a precise reflective structure can be formed in the surface of the glass. The interval and depth of the irregularities are recommended to be adjusted in consideration of the refractive index nd of the glass. Further, a resin film with irregularities may be attached on a surface of glass.

When the roughening treatment is performed by atmospheric plasma processing, while the surface condition of one surface of a glass sheet is maintained, the other surface of the glass sheet can be uniformly subjected to the roughening treatment. Further, it is preferred to use a gas containing F (such as $SF_6$ or $CF_4$) as a source for the atmospheric plasma processing. With this, a plasma containing an HF-based gas is generated, and hence the efficiency of the roughening treatment is enhanced.

Note that when a non-reflective structure is formed on a surface of glass at the time of forming, the non-reflective structure can provide the same effect as that of the roughening treatment even if the roughening treatment is not carried out.

A method of producing the high refractive index glass according to the third embodiment is exemplified as follows. First, a glass batch is manufactured by blending glass materials so that a desired glass composition is achieved. Next, the glass batch is melted, fined, and then formed into a desired shape. Subsequently, the resultant is processed into a desired shape.

EXAMPLES

Hereinafter, examples of the first to third inventions are described. Note that those inventions are by no means limited to the following examples.

Tables 1 to 4 show examples of the first invention (Sample Nos. 1 to 17). Note that those examples also serve as examples of the second and third inventions.

TABLE 1

| | | Example | | | | |
|---|---|---|---|---|---|---|
| | | No. 1 | No. 2 | No. 3 | No. 4 | No. 5 |
| Glass composition (wt %) | $SiO_2$ | 34.6 | 37.6 | 37.6 | 37.6 | 37.6 |
| | $Al_2O_3$ | 1.5 | 1.5 | 1.5 | 1.5 | 1.5 |
| | CaO | 2.9 | 5.9 | 5.9 | 5.9 | 5.9 |
| | SrO | 2.9 | 4.9 | 4.9 | 4.9 | 4.9 |
| | BaO | 27.0 | 27.0 | 27.0 | 27.0 | 27.0 |
| | $La_2O_3$ | 8.8 | 3.8 | 3.8 | 6.8 | 6.8 |
| | $Nb_2O_5$ | 9.4 | 6.4 | 9.4 | 9.4 | 6.4 |
| | $TiO_2$ | 9.7 | 9.7 | 9.7 | 6.7 | 6.7 |
| | $ZrO_2$ | 3.2 | 3.2 | 0.2 | 0.2 | 3.2 |
| $SiO_2 + Al_2O_3 + B_2O_3$ | | 36.1 | 39.1 | 39.1 | 39.1 | 39.1 |
| $(BaO + La_2O_3 + Nb_2O_5 + TiO_2 + ZrO_2)/$ $(SiO_2 + Al_2O_3 + B_2O_3)$ | | 1.61 | 1.28 | 1.28 | 1.28 | 1.28 |
| $(MgO + CaO + SrO + BaO)/$ $(BaO + La_2O_3 + Nb_2O_5 + TiO_2 + ZrO_2)$ | | 0.56 | 0.75 | 0.75 | 0.75 | 0.75 |
| $(TiO_2 + ZrO_2)/(BaO + La_2O_3 + Nb_2O_5)$ | | 0.29 | 0.35 | 0.25 | 0.16 | 0.25 |
| Density [g/cm$^3$] | | — | 3.66 | 3.66 | 3.70 | 3.71 |
| Thermal expansion coefficient [×10$^{-7}$/° C.] | | 74 | 77 | 78 | 79 | 78 |
| Ps [° C.] | | 712 | 711 | 701 | 713 | 703 |
| Ta [° C.] | | 751 | 750 | 739 | 753 | 742 |
| Ts [° C.] | | 881 | 881 | 868 | 889 | 875 |
| $10^4$ dPa · s [° C.] | | 1,042 | 1,042 | 1,026 | 1,038 | 1,054 |
| $10^3$ dPa · s [° C.] | | 1,117 | 1,120 | 1,102 | 1,115 | 1,133 |
| $10^{2.5}$ dPa · s [° C.] | | 1,168 | 1,171 | 1,152 | 1,166 | 1,185 |
| $10^2$ dPa · s [° C.] | | 1,232 | 1,236 | 1,215 | 1,231 | 1,248 |
| TL [° C.] | | 1,061 | 1,077 | 1,053 | 1,066 | 1,077 |
| $\log_{10}\eta TL$ [dPa · s] | | 3.7 | 3.5 | 3.6 | 3.6 | 3.7 |
| Refractive index nd | | 1.74 | 1.72 | 1.72 | 1.71 | 1.71 |

TABLE 2

| | | Example | | | | |
|---|---|---|---|---|---|---|
| | | No. 6 | No. 7 | No. 8 | No. 9 | No. 10 |
| Glass composition (wt %) | $SiO_2$ | 40.6 | 43.6 | 37.6 | 38.8 | 40.6 |
| | $Al_2O_3$ | 1.5 | 1.5 | 1.5 | 1.5 | 1.5 |
| | CaO | 5.9 | 5.9 | 5.9 | 6.1 | 5.9 |
| | SrO | 4.9 | 4.9 | 4.9 | 5.1 | 4.9 |
| | BaO | 27.0 | 27.0 | 27.0 | 27.9 | 27.0 |
| | $La_2O_3$ | 6.8 | 6.8 | 3.8 | 3.9 | 3.8 |
| | $Nb_2O_5$ | 6.4 | 3.4 | 9.4 | 9.7 | 6.4 |
| | $TiO_2$ | 6.7 | 6.7 | 6.7 | 6.9 | 6.7 |
| | $ZrO_2$ | 0.2 | 0.2 | 3.2 | — | 3.2 |
| $SiO_2 + Al_2O_3 + B_2O_3$ | | 42.1 | 45.1 | 39.1 | 40.4 | 42.1 |
| $(BaO + La_2O_3 + Nb_2O_5 + TiO_2 + ZrO_2)/$ $(SiO_2 + Al_2O_3 + B_2O_3)$ | | 1.12 | 0.98 | 1.28 | 1.20 | 1.12 |
| $(MgO + CaO + SrO + BaO)/$ $(BaO + La_2O_3 + Nb_2O_5 + TiO_2 + ZrO_2)$ | | 0.80 | 0.86 | 0.75 | 0.81 | 0.80 |
| $(TiO_2 + ZrO_2)/(BaO + La_2O_3 + Nb_2O_5)$ | | 0.17 | 0.19 | 0.25 | 0.17 | 0.27 |
| Density [g/cm$^3$] | | 3.62 | 3.54 | 3.68 | 3.69 | 3.59 |
| Thermal expansion coefficient [×10$^{-7}$/° C.] | | 78 | 78 | 77 | 79 | 75 |
| Ps [° C.] | | 694 | 692 | 712 | 685 | 707 |
| Ta [° C.] | | 734 | 732 | 752 | 724 | 748 |
| Ts [° C.] | | 873 | 876 | 887 | 860 | 889 |

TABLE 2-continued

|  | Example | | | | |
|---|---|---|---|---|---|
|  | No. 6 | No. 7 | No. 8 | No. 9 | No. 10 |
| $10^4$ dPa·s [° C.] | 1,048 | 1,057 | 1,053 | 1,021 | 1,063 |
| $10^3$ dPa·s [° C.] | 1,132 | 1,147 | 1,132 | 1,099 | 1,148 |
| $10^{2.5}$ dPa·s [° C.] | 1,188 | 1,207 | 1,185 | 1,149 | 1,204 |
| $10^2$ dPa·s [° C.] | 1,257 | 1,281 | 1,250 | 1,214 | 1,274 |
| TL [° C.] | 1,026 | 1,082 | 1,006 | 1,018 | 1,048 |
| $\log_{10}\eta$TL [dPa·s] | 4.3 | 3.7 | 4.8 | 4.1 | 4.2 |
| Refractive index nd | 1.69 | 1.67 | 1.71 | 1.71 | 1.69 |

TABLE 3

| | | Example | | | | |
|---|---|---|---|---|---|---|
| | | No. 11 | No. 12 | No. 13 | No. 14 | No. 15 |
| Glass composition (wt %) | $SiO_2$ | 37.6 | 37.6 | 37.6 | 37.6 | 37.6 |
| | $Al_2O_3$ | 1.5 | 1.5 | 1.5 | 1.5 | 4.5 |
| | MgO | — | — | 3.0 | — | — |
| | CaO | 5.9 | 5.9 | 5.9 | 5.9 | 5.9 |
| | SrO | 4.9 | 4.9 | 4.9 | 4.9 | 4.9 |
| | BaO | 24.0 | 21.0 | 27.0 | 27.0 | 27.0 |
| | ZnO | 3.0 | 6.0 | — | 3.0 | — |
| | $La_2O_3$ | 3.8 | 6.8 | 3.8 | 3.8 | 3.8 |
| | $Nb_2O_5$ | 9.4 | 6.4 | 6.4 | 6.4 | 6.4 |
| | $TiO_2$ | 6.7 | 6.7 | 6.7 | 6.7 | 6.7 |
| | $ZrO_2$ | 3.2 | 3.2 | 3.2 | 3.2 | 3.2 |
| $SiO_2 + Al_2O_3 + B_2O_3$ | | 39.1 | 39.1 | 39.1 | 39.1 | 42.1 |
| $(BaO + La_2O_3 + Nb_2O_5 + TiO_2 + ZrO_2)/(SiO_2 + Al_2O_3 + B_2O_3)$ | | 1.20 | 1.13 | 1.20 | 1.20 | 1.12 |
| $(MgO + CaO + SrO + BaO)/(BaO + La_2O_3 + Nb_2O_5 + TiO_2 + ZrO_2)$ | | 0.74 | 0.72 | 0.87 | 0.80 | 0.80 |
| $(TiO_2 + ZrO_2)/(BaO + La_2O_3 + Nb_2O_5)$ | | 0.27 | 0.29 | 0.27 | 0.27 | 0.27 |
| Density [g/cm³] | | 3.68 | 3.70 | 3.66 | 3.72 | 3.61 |
| Thermal expansion coefficient [×$10^{-7}$/° C.] | | 75 | 74 | 78 | 75 | 75 |
| Ps [° C.] | | 696 | 685 | 704 | 698 | 713 |
| Ta [° C.] | | 736 | 726 | 743 | 738 | 754 |
| Ts [° C.] | | 875 | 866 | 881 | 878 | 894 |
| $10^4$ dPa·s [° C.] | | 1,040 | 1,030 | 1,041 | 1,042 | 1,065 |
| $10^3$ dPa·s [° C.] | | 1,119 | 1,108 | 1,118 | 1,122 | 1,151 |
| $10^{2.5}$ dPa·s [° C.] | | 1,171 | 1,159 | 1,168 | 1,174 | 1,207 |
| $10^2$ dPa·s [° C.] | | 1,236 | 1,223 | 1,230 | 1,239 | 1,278 |
| TL [° C.] | | 1,030 | 1,050 | 1,070 | 1,046 | 1,053 |
| $\log_{10}\eta$TL [dPa·s] | | 4.2 | 3.7 | 3.6 | 3.9 | 4.2 |
| Refractive index nd | | 1.71 | 1.71 | 1.71 | 1.71 | 1.69 |

TABLE 4

| | | Example | |
|---|---|---|---|
| | | No. 16 | No. 17 |
| Glass composition (wt %) | $SiO_2$ | 45.0 | 45.0 |
| | $Al_2O_3$ | 5.0 | 5.0 |
| | CaO | 5.9 | 5.9 |
| | SrO | 4.9 | 4.9 |
| | BaO | 26.2 | 29.2 |
| | $La_2O_3$ | 6.0 | 3.0 |
| | $TiO_2$ | 4.0 | 4.0 |
| | $ZrO_2$ | 3.0 | 3.0 |
| $SiO_2 + Al_2O_3 + B_2O_3$ | | 50.0 | 50.0 |
| $(BaO + La_2O_3 + Nb_2O_5 + TiO_2 + ZrO_2)/(SiO_2 + Al_2O_3 + B_2O_3)$ | | 0.78 | 0.78 |
| $(MgO + CaO + SrO + BaO)/(BaO + La_2O_3 + Nb_2O_5 + TiO_2 + ZrO_2)$ | | 0.94 | 1.02 |
| $(TiO_2 + ZrO_2)/(BaO + La_2O_3 + Nb_2O_5)$ | | 0.22 | 0.22 |
| Density [g/cm³] | | 3.42 | 3.41 |
| Thermal expansion coefficient [×$10^{-7}$/° C.] | | 72 | 72 |
| Ps [° C.] | | 704 | 699 |
| Ta [° C.] | | 748 | 743 |
| Ts [° C.] | | 907 | 902 |
| $10^4$ dPa·s [° C.] | | 1,115 | 1,108 |
| $10^3$ dPa·s [° C.] | | 1,221 | 1,214 |
| $10^{2.5}$ dPa·s [° C.] | | 1,291 | 1,283 |
| $10^2$ dPa·s [° C.] | | 1,380 | 1,372 |
| TL [° C.] | | 1,006 | 1,051 |
| $\log_{10}\eta$TL [dPa·s] | | 5.5 | 4.8 |
| Refractive index nd | | 1.63 | 1.63 |

First, glass materials were blended so that each glass composition described in Tables 1 to 4 was achieved. After that, the resultant glass batch was fed into a glass melting furnace and melted at 1,500 to 1,600° C. for 4 hours. Next, the resultant molten glass was poured on a carbon sheet to be formed into a glass sheet, followed by predetermined annealing treatment. Finally, the resultant glass sheet was evaluated for its various characteristics.

The density is a value obtained by measurement using a well-known Archimedes method.

The thermal expansion coefficient is a value obtained by measurement of an average thermal expansion coefficient at 30 to 380° C. with a dilatometer. A cylindrical sample (having end surfaces subjected to R processing) having a size of 5 mm in diameter by 20 mm in length was used as a measurement sample.

The strain point Ps is a value obtained by measurement based on a method as described in ASTM C336-71. Note that as the strain point Ps becomes higher, the heat resistance becomes higher.

The annealing point Ta and the softening point Ts are values obtained by measurement based on a method as described in ASTM C338-93.

The temperatures at viscosities of $10^{4.0}$ dPa·s, $10^{3.0}$ dPa·s, $10^{2.5}$ dPa·s, and $10^{2.0}$ dPa·s are values obtained by measurement using a platinum sphere pull up method. Note that as each of the temperatures becomes lower, the meltability becomes more excellent.

The liquidus temperature TL is a value obtained by measuring a temperature at which crystals of glass deposit when glass powder that has passed through a standard 30-mesh sieve (500 μm) and remained on a 50-mesh sieve (300 μm) is placed in a platinum boat and kept in a gradient heating furnace for 24 hours. Further, the liquidus viscosity $\log_{10} \eta TL$ is a value obtained by measuring the viscosity of glass at its liquidus temperature by a platinum sphere pull up method. Note that as the liquidus viscosity becomes higher and the liquidus temperature becomes lower, each of the denitrification resistance and the formability becomes more excellent.

The refractive index nd is a value obtained by producing samples having a rectangular parallelepiped shape of 25 mm by 25 mm by about 3 mm, then subjecting the samples to annealing treatment at a cooling rate of 0.1° C./min in the temperature range from (Ta+30° C.) to (strain point-50° C.), and subsequently measuring the refractive index with a refractometer KPR-200 manufactured by Kalnew Co., Ltd. in a state in which an immersion liquid having a refractive index matching to that of the samples is immersed between two glass samples.

Further, glass materials were blended so that each of the glass compositions described in Sample Nos. 8, 16, and 17 was achieved, and then the resultant glass batch was loaded into a continuous kiln and melted at a temperature of 1,500 to 1,600° C. Subsequently, the resultant molten glass was formed into a glass sheet having a thickness of 0.5 mm by an overflow down-draw method. The resultant glass sheet was measured for its average surface roughness (Ra). As a result, a value for the average surface roughness was 2 Å. Note that the term "average surface roughness (Ra)" refers to a value obtained by measurement using a method in accordance with JIS B0601: 2001.

Hereinafter, examples of the fourth to sixth inventions are described. Note that those inventions are by no means limited to the following examples.

Tables 5 and 6 show examples of the fourth invention (Sample Nos. 18 to 31). Note that those examples also serve as examples of the fifth and sixth inventions.

TABLE 5

| | | Example | | | | | | |
|---|---|---|---|---|---|---|---|---|
| | | No. 18 | No. 19 | No. 20 | No. 21 | No. 22 | No. 23 | No. 24 |
| Glass composition (wt %) | $SiO_2$ | 40.6 | 37.6 | 38.8 | 45.0 | 45.0 | 45.0 | 45.0 |
| | $Al_2O_3$ | 1.5 | 1.5 | 1.5 | 5.0 | 5.0 | 5.0 | 5.0 |
| | MgO | — | — | — | 4.2 | 4.2 | — | — |
| | CaO | 6.9 | 5.9 | 6.1 | 5.9 | 5.9 | 5.9 | 5.9 |
| | SrO | 5.9 | 4.9 | 5.1 | 10.9 | 10.9 | 4.9 | 4.9 |
| | BaO | 28.0 | 27.0 | 24.7 | 16.0 | 16.0 | 26.2 | 23.2 |
| | $La_2O_3$ | 6.8 | 3.8 | 7.0 | 3.0 | 3.0 | — | 3.0 |
| | $Nb_2O_5$ | 6.4 | 9.4 | 6.6 | — | — | — | — |
| | $ZrO_2$ | 0.2 | 3.2 | 3.3 | — | 3.0 | 3.0 | 3.0 |
| | $TiO_2$ | 3.7 | 6.7 | 6.9 | 10.0 | 7.0 | 10.0 | 10.0 |
| (MgO + CaO)/(SrO + BaO) | | 0.2 | 0.18 | 0.2 | 0.4 | 0.4 | 0.2 | 0.2 |
| $La_2O_3 + Nb_2O_5$ | | 13.2 | 13.2 | 13.2 | 3.0 | 3.0 | — | 3.0 |
| Density [g/cm³] | | 3.64 | 3.68 | 3.66 | 3.32 | 3.34 | 3.32 | 3.32 |
| Thermal expansion coefficient [×$10^{-7}$/° C.] | | 82 | 77 | 77 | 75 | 74 | 69 | 68 |
| Ps [° C.] | | 693 | 712 | 714 | 684 | 692 | 701 | 705 |
| Ta [° C.] | | 734 | 752 | 753 | 724 | 734 | 742 | 746 |
| Ts [° C.] | | 876 | 887 | 890 | 867 | 883 | 892 | 896 |
| $10^4$ dPa·s [° C.] | | 1,050 | 1,053 | 1,058 | 1,040 | 1,067 | 1,081 | 1,090 |
| $10^3$ dPa·s [° C.] | | 1,133 | 1,132 | 1,139 | 1,128 | 1,158 | 1,182 | 1,192 |
| $10^{2.5}$ dPa·s [° C.] | | 1,188 | 1,185 | 1,192 | 1,187 | 1,219 | 1,249 | 1,261 |
| $10^2$ dPa·s [° C.] | | 1,256 | 1,250 | 1,257 | 1,262 | 1,296 | 1,338 | 1,349 |
| TL [° C.] | | 1,020 | 1,006 | 1,025 | 1,058 | 1,105 | 1,100 | 1,123 |
| $\log_{10} \eta TL$ [dPa·s] | | 4.5 | 4.8 | 4.5 | 3.8 | 3.5 | 3.8 | 3.6 |
| Refractive index nd | | 1.67 | 1.71 | 1.70 | 1.66 | 1.65 | 1.65 | 1.66 |

TABLE 6

| | | Example | | | | | | |
|---|---|---|---|---|---|---|---|---|
| | | No. 25 | No. 26 | No. 27 | No. 28 | No. 29 | No. 30 | No. 31 |
| Glass composition (wt %) | $SiO_2$ | 44.9 | 44.9 | 41.9 | 44.9 | 44.9 | 44.9 | 44.9 |
| | $Al_2O_3$ | 5.0 | 5.0 | 5.0 | 5.0 | 5.0 | 5.0 | 5.0 |
| | CaO | 5.9 | 5.9 | 5.9 | 5.9 | 5.9 | 6.9 | 6.9 |
| | SrO | 4.9 | 4.9 | 4.9 | 4.9 | 4.9 | 5.9 | 5.9 |
| | BaO | 26.2 | 26.2 | 26.2 | 26.2 | 29.2 | 27.2 | 27.2 |
| | $La_2O_3$ | 3.0 | 3.0 | 6.0 | 6.0 | 3.0 | 3.0 | 3.0 |
| | $ZrO_2$ | 3.0 | — | 3.0 | 3.0 | 3.0 | 3.0 | 3.0 |
| | $TiO_2$ | 7.0 | 10.0 | 7.0 | 4.0 | 4.0 | 4.0 | 4.0 |
| | $SnO_2$ | 0.1 | 0.1 | 0.1 | 0.1 | 0.1 | 0.1 | 0.1 |
| (MgO + CaO)/(SrO + BaO) | | 0.2 | 0.2 | 0.2 | 0.2 | 0.2 | 0.2 | 0.2 |
| $La_2O_3 + Nb_2O_5$ | | 3.0 | 3.0 | 6.0 | 6.0 | 3.0 | 3.0 | 3.0 |
| Density [g/cm³] | | 3.04 | 3.35 | 3.49 | 3.42 | 3.41 | 3.41 | 3.40 |
| Thermal expansion coefficient [×10⁻⁷/° C.] | | 71 | 72 | 74 | 72 | 72 | 75 | 75 |
| Ps [° C.] | | 703 | 692 | 706 | 704 | 699 | 699 | 699 |
| Ta [° C.] | | 746 | 732 | 748 | 748 | 743 | 742 | 742 |
| Ts [° C.] | | 899 | 877 | 897 | 907 | 902 | 899 | 899 |
| $10^4$ dPa·s [° C.] | | 1,100 | 1,069 | 1,089 | 1,114 | 1,108 | 1,104 | 1,103 |
| $10^3$ dPa·s [° C.] | | 1,203 | 1,170 | 1,185 | 1,220 | 1,214 | 1,207 | 1,207 |
| $10^{2.5}$ dPa·s [° C.] | | 1,273 | 1,238 | 1,249 | 1,290 | 1,283 | 1,276 | 1,276 |
| $10^2$ dPa·s [° C.] | | 1,361 | 1,328 | 1,332 | 1,378 | 1,372 | 1,365 | 1,365 |
| TL [° C.] | | 1,054 | 1,082 | 1,078 | 1,000 | 1,051 | 1,046 | 1,040 |
| $\log_{10}\eta TL$ [dPa·s] | | 4.6 | 3.9 | 4.1 | 5.6 | 4.8 | 4.8 | 4.8 |
| Refractive index nd | | 1.65 | 1.65 | 1.66 | 1.63 | 1.63 | 1.63 | 1.63 |

First, glass materials were blended so that each of the glass compositions described in Tables 5 and 6 was achieved. After that, the resultant glass batch was fed into a glass melting furnace and melted at 1,500 to 1,600° C. for 4 hours. Next, the resultant molten glass was poured on a carbon sheet to be formed into a glass sheet, followed by predetermined annealing treatment. Finally, the resultant glass sheet was evaluated for its various characteristics.

The density is a value obtained by measurement using a well-known Archimedes method.

The thermal expansion coefficient is a value obtained by measurement of an average thermal expansion coefficient at 30 to 380° C. with a dilatometer. A cylindrical sample (having end surfaces subjected to R processing) having a size of 5 mm in diameter by 20 mm in length was used as a measurement sample.

The strain point Ps is a value obtained by measurement based on a method as described in ASTM C336-71. Note that as the strain point Ps becomes higher, the heat resistance becomes higher.

The annealing point Ta and the softening point Ts are values obtained by measurement based on a method as described in ASTM C338-93.

The temperatures at viscosities of $10^{4.0}$ $^{dPa·s}$, $10^{3.0}$ dPa·s, $10^{2.5}$ dPa·s, and $10^{2.0}$ dPa·s are values obtained by measurement using a platinum sphere pull up method. Note that as each of the temperatures becomes lower, the meltability becomes more excellent.

The liquidus temperature TL is a value obtained by measuring a temperature at which crystals of glass deposit when glass powder that has passed through a standard 30-mesh sieve (500 μm) and remained on a 50-mesh sieve (300 μm) is placed in a platinum boat and kept in a gradient heating furnace for 24 hours. Further, the liquidus viscosity $\log_{10}\eta TL$ is a value obtained by measuring the viscosity of glass at its liquidus temperature by a platinum sphere pull up method. Note that as the liquidus viscosity becomes higher and the liquidus temperature becomes lower, each of the denitrification resistance and the formability becomes more excellent.

The refractive index nd is a value obtained by producing samples having a rectangular parallelepiped shape of 25 mm by 25 mm by about 3 mm, then subjecting the samples to annealing treatment at a cooling rate of 0.1° C./min in the temperature range from (Ta+30° C.) to (strain point-50° C.), and subsequently measuring the refractive index with a refractometer KPR-200 manufactured by Kalnew Co., Ltd. in a state in which an immersion liquid having a refractive index matching to that of the samples is immersed between two glass samples.

Further, glass materials were blended so that each of the glass compositions described in Sample Nos. 18 to 20, 25, and 28 to 31 was achieved, and then the resultant glass batch was loaded into a continuous kiln and melted at a temperature of 1,500 to 1,600° C. Subsequently, the resultant molten glass was formed into a glass sheet having a thickness of 0.5 mm by an overflow down-draw method.

The resultant glass sheet was measured for its average surface roughness (Ra). As a result, a value for the average surface roughness was 2 Å. Note that the term "average surface roughness (Ra)" refers to a value obtained by measurement using a method in accordance with JIS B0601: 2001.

Hereinafter, examples of the seventh to ninth inventions are described. Note that those inventions are by no means limited to the following examples.

Tables 7 to 10 show examples of the seventh invention (Sample Nos. 32 to 50). Note that those examples also serve as examples of the eighth and ninth inventions.

TABLE 7

|  |  | Example | | | | |
| --- | --- | --- | --- | --- | --- | --- |
|  |  | No. 32 | No. 33 | No. 34 | No. 35 | No. 36 |
| Glass composition (mol %) | $SiO_2$ | 62.1 | 62.1 | 61.5 | 61.5 | 60.9 |
|  | $Al_2O_3$ | 3.4 | 3.4 | 1.3 | 3.4 | 3.3 |
|  | CaO | 8.7 | 8.7 | 8.6 | 8.6 | 10.0 |
|  | SrO | 3.9 | 3.9 | 3.9 | 3.9 | 4.6 |
|  | BaO | 14.2 | 14.2 | 14.0 | 15.7 | 14.4 |
|  | $La_2O_3$ | 1.5 | 0.8 | 1.5 | 0.8 | 0.7 |
|  | $ZrO_2$ | 2.0 | 2.0 | 2.0 | 2.0 | 2.0 |
|  | $TiO_2$ | 4.2 | 4.2 | 7.2 | 4.1 | 4.1 |
|  | $Gd_2O_3$ | — | 0.7 | — | — | — |
| $SiO_2 + Al_2O_3 + B_2O_3$ |  | 65.5 | 65.5 | 62.8 | 64.9 | 64.2 |
| $MgO + CaO + SrO + BaO$ |  | 26.8 | 26.8 | 26.5 | 28.2 | 29.0 |
| $BaO + La_2O_3 + Nb_2O_5 + TiO_2 + ZrO_2$ |  | 21.9 | 21.1 | 24.7 | 22.5 | 21.2 |
| $B_2O_3/SiO_2$ |  | 0 | 0 | 0 | 0 | 0 |
| $SiO_2/(MgO + CaO + SrO + BaO + La_2O_3 + Nb_2O_5)$ |  | 2.2 | 2.3 | 2.2 | 2.1 | 2.0 |
| $(MgO + CaO + SrO + BaO)/(MgO + CaO + SrO + BaO + La_2O_3 + Nb_2O_5 + Gd_2O_3)$ |  | 0.95 | 0.95 | 0.95 | 0.97 | 0.97 |
| Density [g/cm³] |  | 3.42 | 3.41 | 3.46 | 3.41 | 3.41 |
| Thermal expansion coefficient [×10⁻⁷/° C.] |  | 72 | 72 | 74 | 72 | 75 |
| Ps [° C.] |  | 704 | 706 | 700 | 699 | 699 |
| Ta [° C.] |  | 748 | 751 | 742 | 743 | 742 |
| Ts [° C.] |  | 907 | 912 | 891 | 902 | 899 |
| $10^4$ dPa · s [° C.] |  | 1,115 | 1,118 | 1,085 | 1,108 | 1,104 |
| $10^3$ dPa · s [° C.] |  | 1,221 | 1,224 | 1,182 | 1,214 | 1,207 |
| $10^{2.5}$ dPa · s [° C.] |  | 1,291 | 1,293 | 1,247 | 1,283 | 1,276 |
| $10^2$ dPa · s [° C.] |  | 1,380 | 1,384 | 1,330 | 1,372 | 1,365 |
| TL [° C.] |  | 1,006 | 1,035 | Unmeasured | 1,051 | 1,046 |
| $\log_{10}\eta TL$ [dPa · s] |  | 5.5 | 5.1 | Unmeasured | 4.8 | 4.8 |
| Refractive index nd |  | 1.63 | 1.63 | 1.66 | 1.63 | 1.63 |

TABLE 8

|  |  | Example | | | | |
| --- | --- | --- | --- | --- | --- | --- |
|  |  | No. 37 | No. 38 | No. 39 | No. 40 | No. 41 |
| Glass composition (mol %) | $SiO_2$ | 63.0 | 60.9 | 57.4 | 59.7 | 56.5 |
|  | $Al_2O_3$ | 1.4 | 3.3 | 1.1 | 1.1 | 3.3 |
|  | CaO | 8.8 | 10.0 | 9.6 | 9.3 | 9.5 |
|  | SrO | 4.0 | 4.6 | 4.3 | 4.2 | 4.3 |
|  | BaO | 14.4 | 14.4 | 16.1 | 15.5 | 15.9 |
|  | $La_2O_3$ | 1.5 | 0.7 | 1.9 | 1.0 | 1.1 |
|  | $Nb_2O_5$ | — | — | 2.2 | 2.1 | 2.2 |
|  | $ZrO_2$ | 2.0 | 2.0 | 2.4 | 2.3 | 2.3 |
|  | $TiO_2$ | 4.2 | 4.1 | 4.2 | 4.1 | 4.2 |
|  | $Gd_2O_3$ | 0.7 | — | 0.8 | 0.7 | 0.7 |
| $SiO_2 + Al_2O_3 + B_2O_3$ |  | 64.4 | 64.2 | 58.5 | 60.8 | 59.8 |
| $MgO + CaO + SrO + BaO$ |  | 27.2 | 29.0 | 30.1 | 29.0 | 29.7 |
| $BaO + La_2O_3 + Nb_2O_5 + TiO_2 + ZrO_2$ |  | 22.2 | 21.2 | 26.9 | 25.1 | 25.7 |
| $B_2O_3/SiO_2$ |  | 0 | 0 | 0 | 0 | 0 |
| $SiO_2/(MgO + CaO + SrO + BaO + La_2O_3 + Nb_2O_5)$ |  | 2.2 | 2.1 | 1.7 | 1.9 | 1.7 |
| $(MgO + CaO + SrO + BaO)/(MgO + CaO + SrO + BaO + La_2O_3 + Nb_2O_5 + Gd_2O_3)$ |  | 0.92 | 0.97 | 0.86 | 0.88 | 0.88 |
| Density [g/cm³] |  | 3.52 | 3.40 | 3.76 | 3.63 | 3.65 |
| Thermal expansion coefficient [×10⁻⁷/° C.] |  | 75 | 75 | 79 | 75 | 76 |
| Ps [° C.] |  | 703 | 699 | 716 | 710 | 718 |
| Ta [° C.] |  | 746 | 742 | 757 | 752 | 760 |
| Ts [° C.] |  | 900 | 899 | 899 | 900 | 906 |
| $10^4$ dPa · s [° C.] |  | 1,102 | 1,103 | 1,069 | 1,082 | 1,086 |
| $10^3$ dPa · s [° C.] |  | 1,202 | 1,207 | 1,151 | 1,172 | 1,174 |
| $10^{2.5}$ dPa · s [° C.] |  | 1,269 | 1,276 | 1,204 | 1,230 | 1,232 |
| $10^2$ dPa · s [° C.] |  | 1,354 | 1,365 | 1,271 | 1,304 | 1,305 |
| TL [° C.] |  | 1,086 | 1,040 | 1,081 | 1,043 | 1,063 |
| $\log_{10}\eta TL$ [dPa · s] |  | 4.2 | 4.8 | 3.8 | 4.6 | 4.3 |
| Refractive index nd |  | 1.64 | 1.63 | 1.69 | 1.67 | 1.68 |

TABLE 9

|  |  | Example | | | | |
| --- | --- | --- | --- | --- | --- | --- |
|  |  | No. 42 | No. 43 | No. 44 | No. 45 | No. 46 |
| Glass composition (mol %) | $SiO_2$ | 59.0 | 60.0 | 59.8 | 58.9 | 57.5 |
|  | $Al_2O_3$ | 3.2 | 3.5 | 3.5 | 3.4 | 3.4 |
|  | CaO | 9.2 | 9.0 | 9.0 | 10.3 | 11.6 |
|  | SrO | 4.1 | 4.1 | 4.1 | 4.8 | 5.5 |
|  | BaO | 15.4 | 14.7 | 14.6 | 14.9 | 15.1 |
|  | $La_2O_3$ | 1.0 | 1.6 | 1.6 | 1.5 | 0.8 |
|  | $Nb_2O_5$ | 1.1 | — | 1.0 | — | — |
|  | $ZrO_2$ | 2.3 | 2.1 | 2.1 | 2.0 | 2.0 |
|  | $TiO_2$ | 4.0 | 4.3 | 4.3 | 4.2 | 4.1 |
|  | $Gd_2O_3$ | 0.7 | 0.7 | — | — | — |
| $SiO_2 + Al_2O_3 + B_2O_3$ | | 62.2 | 63.5 | 63.3 | 62.3 | 60.9 |
| $MgO + CaO + SrO + BaO$ | | 28.7 | 27.8 | 27.7 | 30.0 | 32.2 |
| $BaO + La_2O_3 + Nb_2O_5 + TiO_2 + ZrO_2$ | | 23.8 | 22.6 | 23.6 | 22.7 | 22.0 |
| $B_2O_3/SiO_2$ | | 0 | 0 | 0 | 0 | 0 |
| $SiO_2/(MgO + CaO + SrO + BaO + La_2O_3 + Nb_2O_5)$ | | 1.9 | 2.0 | 2.0 | 1.9 | 1.7 |
| $(MgO + CaO + SrO + BaO)/(MgO + CaO + SrO + BaO + La_2O_3 + Nb_2O_5 + Gd_2O_3)$ | | 0.91 | 0.92 | 0.92 | 0.95 | 0.98 |
| Density [g/cm$^3$] | | 3.57 | 3.53 | 3.37 | 3.51 | 3.50 |
| Thermal expansion coefficient [×10$^{-7}$/° C.] | | 74 | 74 | 70 | 77 | 79 |
| Ps [° C.] | | 713 | 712 | 703 | 705 | 700 |
| Ta [° C.] | | 756 | 755 | 747 | 747 | 742 |
| Ts [° C.] | | 908 | 909 | 905 | 899 | 893 |
| $10^4$ dPa·s [° C.] | | 1,095 | 1,108 | 1,106 | 1,092 | 1,084 |
| $10^3$ dPa·s [° C.] | | 1,188 | 1,207 | 1,211 | 1,189 | 1,179 |
| $10^{2.5}$ dPa·s [° C.] | | 1,250 | 1,272 | 1,282 | 1,252 | 1,242 |
| $10^2$ dPa·s [° C.] | | 1,328 | 1,356 | 1,370 | 1,332 | 1,320 |
| TL [° C.] | | 1,051 | 1,083 | 1,023 | 1,050 | 1,065 |
| $\log_{10}\eta$TL [dPa·s] | | 4.6 | 4.3 | 5.2 | 4.6 | 4.3 |
| Refractive index nd | | 1.66 | 1.65 | 1.64 | 1.65 | 1.65 |

TABLE 10

|  |  | Example | | | |
| --- | --- | --- | --- | --- | --- |
|  |  | No. 47 | No. 48 | No. 49 | No. 50 |
| Glass composition (mol %) | $SiO_2$ | 59.4 | 57.9 | 58.9 | 59.5 |
|  | $Al_2O_3$ | 3.5 | 3.4 | 3.5 | 3.5 |
|  | CaO | 8.9 | 13.1 | 8.9 | 9.0 |
|  | SrO | 4.0 | 3.9 | 6.4 | 4.0 |
|  | BaO | 16.2 | 14.1 | 14.4 | 14.6 |
|  | $La_2O_3$ | 1.6 | 1.5 | 1.6 | 2.0 |
|  | $ZrO_2$ | 2.1 | 2.0 | 2.1 | 3.1 |
|  | $TiO_2$ | 4.3 | 4.1 | 4.2 | 4.3 |
| $SiO_2 + Al_2O_3 + B_2O_3$ | | 62.9 | 61.3 | 62.4 | 63.0 |
| $MgO + CaO + SrO + BaO$ | | 29.2 | 31.2 | 29.7 | 27.6 |
| $BaO + La_2O_3 + Nb_2O_5 + TiO_2 + ZrO_2$ | | 24.1 | 21.8 | 22.3 | 23.9 |
| $B_2O_3/SiO_2$ | | 0 | 0 | 0 | 0 |
| $SiO_2/(MgO + CaO + SrO + BaO + La_2O_3 + Nb_2O_5)$ | | 1.9 | 1.8 | 1.9 | 2.0 |
| $(MgO + CaO + SrO + BaO)/(MgO + CaO + SrO + BaO + La_2O_3 + Nb_2O_5 + Gd_2O_3)$ | | 0.95 | 0.95 | 0.95 | 0.93 |
| Density [g/cm$^3$] | | 3.53 | 3.49 | 3.54 | 3.54 |
| Thermal expansion coefficient [×10$^{-7}$/° C.] | | 76 | 77 | 78 | 73 |
| Ps [° C.] | | 705 | 706 | 704 | 716 |
| Ta [° C.] | | 748 | 748 | 747 | 760 |
| Ts [° C.] | | 901 | 898 | 899 | 915 |
| $10^4$ dPa·s [° C.] | | 1,100 | 1,088 | 1,091 | 1,113 |
| $10^3$ dPa·s [° C.] | | 1,199 | 1,183 | 1,187 | 1,211 |
| $10^{2.5}$ dPa·s [° C.] | | 1,264 | 1,245 | 1,250 | 1,277 |
| $10^2$ dPa·s [° C.] | | 1,347 | 1,324 | 1,332 | 1,358 |
| TL [° C.] | | 1,058 | 1,079 | 1,044 | 1,076 |
| $\log_{10}\eta$TL [dPa·s] | | 4.6 | 4.1 | 4.7 | 4.5 |
| Refractive index nd | | 1.65 | 1.65 | 1.65 | 1.66 |

First, glass materials were blended so that each of the glass compositions described in Tables 7 to 10 was achieved. After that, the resultant glass batch was fed into a glass melting furnace and melted at 1,500 to 1,600° C. for 4 hours. Next, the resultant molten glass was poured on a carbon sheet to be formed into a glass sheet, followed by predetermined annealing treatment. Finally, the resultant glass sheet was evaluated for its various characteristics.

The density is a value obtained by measurement using a well-known Archimedes method.

The thermal expansion coefficient is a value obtained by measurement of an average thermal expansion coefficient at 30 to 380° C. with a dilatometer. A cylindrical sample (having end surfaces subjected to R processing) having a size of 5 mm in diameter by 20 mm in length was used as a measurement sample.

The strain point Ps is a value obtained by measurement based on a method as described in ASTM C336-71. Note that as the strain point Ps becomes higher, the heat resistance becomes higher.

The annealing point Ta and the softening point Ts are values obtained by measurement based on a method as described in ASTM C338-93.

The temperatures at viscosities of $10^{4.0}$ dPa·s, $10^{3.0}$ dPa·s, $10^{2.5}$ dPa·s, and $10^{2.0}$ dPa·s are values obtained by measurement using a platinum sphere pull up method. Note that as each of the temperatures becomes lower, the meltability becomes more excellent.

The liquidus temperature TL is a value obtained by measuring a temperature at which crystals of glass deposit when glass powder that has passed through a standard 30-mesh sieve (500 μm) and remained on a 50-mesh sieve (300 μm) is placed in a platinum boat and kept in a gradient heating furnace for 24 hours. Further, the liquidus viscosity $\log_{10} \eta TL$ is a value obtained by measuring the viscosity of glass at its liquidus temperature by a platinum sphere pull up method. Note that as the liquidus viscosity becomes higher and the liquidus temperature becomes lower, each of the denitrification resistance and the formability becomes more excellent.

The refractive index nd is a value obtained by producing samples having a rectangular parallelepiped shape of 25 mm by 25 mm by about 3 mm, then subjecting the samples to annealing treatment at a cooling rate of 0.1° C./min in the temperature range from (Ta+30° C.) to (strain point-50° C.), and subsequently measuring the refractive index with a refractometer KPR-200 manufactured by Kalnew Co., Ltd. in a state in which an immersion liquid having a refractive index matching to that of the samples is immersed between two glass samples.

Further, glass materials were blended so that each of the glass compositions described in Sample Nos. 32, 33, 35, 36, 38, 40, 42, 44, 45, 47, 49, and 50 was achieved, and then the resultant glass batch was loaded into a continuous kiln and melted at a temperature of 1,500 to 1,600° C. Subsequently, the resultant molten glass was formed into a glass sheet having a thickness of 0.5 mm by an overflow down-draw method. The resultant glass sheet was measured for its average surface roughness (Ra). As a result, a value for the average surface roughness was 2 Å. Note that the term "average surface roughness (Ra)" refers to a value obtained by measurement using a method in accordance with JIS B0601: 2001.

The invention claimed is:

1. A high refractive index glass sheet, comprising, as a glass composition in terms of mass %, 0.1 to 20% of $TiO_2$, 0 to 10% of CaO, 10 to 50% of MgO+CaO+SrO, 40 to 60% of $SiO_2+Al_2O_3+B_2O_3$ and 0 to 2% of $Li_2O+Na_2O+K_2O$, having a mass ratio $(BaO+La_2O_3+Nb_2O_5+TiO_2+ZrO_2)/(SiO_2+Al_2O_3+B_2O_3)$ of 0.1 to 1.25, a mass ratio $(MgO+CaO+SrO+BaO)/(BaO+La_2O_3+Nb_2O_5+TiO_2+ZrO_2)$ of 0.2 to 10, and a mass ratio $(TiO_2+ZrO_2)/(BaO+La_2O_3+Nb_2O_5)$ of 0.001 to 40, and having a refractive index nd of 1.55 to 2.3.

2. The high refractive index glass sheet according to claim 1, wherein the high refractive index glass has a liquidus viscosity of $10^{3.0}$ dPa·s or more.

3. The high refractive index glass sheet according to claim 1, wherein the high refractive index glass is formed by one of an overflow down-draw method and a slot down-draw method.

4. The high refractive index glass sheet according to claim 1, wherein the high refractive index glass comprises at least one unpolished surface, the unpolished surface having a surface roughness Ra of 10 Å or less.

5. The high refractive index glass sheet according to claim 1, comprising, as a glass composition in terms of mass %, 10.8 to 50% of MgO+CaO+SrO.

6. A high refractive index glass sheet, comprising, as a glass composition in terms of mass %, 10 to 60% of $SiO_2$, 0 to 5% of $B_2O_3$, 0.1 to 60% of BaO, 0.1 to 20% of $TiO_2$, 0 to 10% of CaO, 10 to 50% of MgO+CaO+SrO, 0.1 to 40% of $La_2O_3+Nb_2O_5$, 40 to 60% of $SiO_2+Al_2O_3+B_2O_3$, and 0 to 2% of $Li_2O+Na_2O+K_2O$, having a value for a mass ratio (MgO+CaO)/(SrO+BaO) of 0 to 0.5, and having a strain point of 600° C. or more and a refractive index nd of 1.55 to 2.3.

7. The high refractive index glass sheet according to claim 6, wherein the high refractive index glass has a liquidus viscosity of $10^{3.0}$ dPa·s or more.

8. The high refractive index glass sheet according to claim 6, wherein the high refractive index glass comprises, as a glass composition in terms of mass %, 15 to 60% of $SiO_2$, 0 to 5% of $B_2O_3$, 0.1 to 40% of BaO, 0.1 to 30% of $La_2O_3+Nb_2O_5$, and 0 to 2% of $Li_2O+Na_2O+K_2O$, has a value for a mass ratio (MgO+CaO)/(SrO+BaO) of 0 to 0.5, and has a strain point of 630° C. or more and a refractive index nd of 1.55 to 2.2.

9. The high refractive index glass sheet according to claim 6, wherein the high refractive index glass comprises, as a glass composition in terms of mass %, 20 to 60% of $SiO_2$, 0 to 5% of $B_2O_3$, 5 to 40% of BaO, 0.1 to 25% of $La_2O_3+Nb_2O_5$, and 0 to 2% of $Li_2O+Na_2O+K_2O$, has a value for a mass ratio (MgO+CaO)/(SrO+BaO) of 0 to 0.4, and has a strain point of 650° C. or more and a refractive index nd of 1.55 to 2.1.

10. The high refractive index glass sheet according to claim 6, wherein the high refractive index glass has a density of 4.0 g/cm³ or less.

11. The high refractive index glass sheet according to claim 6, wherein the high refractive index glass is formed by one of an overflow down-draw method and a slot down-draw method.

12. The high refractive index glass sheet according to claim 6, wherein the high refractive index glass comprises at least one unpolished surface, the unpolished surface having a surface roughness Ra of 10 Å or less.

13. The high refractive index glass sheet according to claim 6, comprising, as a glass composition in terms of mass %, 10.8 to 50% of MgO+CaO+SrO.

* * * * *